United States Patent
Uasa et al.

(10) Patent No.: US 6,380,808 B1
(45) Date of Patent: Apr. 30, 2002

(54) PUSH-PULL AMPLIFIER CIRCUIT WITH IDLING CURRENT CONTROL

(75) Inventors: Tachio Uasa, Kawasaki (JP); Yang Liu, Shanghai (CN)

(73) Assignee: Fujitsu, Limited, Kawasaki (JP)

( * ) Notice: Subject to any disclaimer, the term of this patent is extended or adjusted under 35 U.S.C. 154(b) by 0 days.

(21) Appl. No.: 09/472,245

(22) Filed: Dec. 27, 1999

(30) Foreign Application Priority Data

Dec. 25, 1998 (JP) ............................................ 10-370605
Dec. 28, 1998 (JP) ............................................ 10-373147

(51) Int. Cl.[7] ................................................. H03F 3/18
(52) U.S. Cl. ...................... 330/263; 330/264; 330/267; 330/51
(58) Field of Search .................................. 330/263, 264, 330/267, 51

(56) References Cited

U.S. PATENT DOCUMENTS

| | | | |
|---|---|---|---|
| 5,045,803 A | * 9/1991 | Perroud et al. | ................ 330/51 |
| 5,606,287 A | 2/1997 | Kobayashi et al. | ......... 330/255 |
| 5,673,002 A | 9/1997 | Kobayashi et al. | ......... 330/288 |

FOREIGN PATENT DOCUMENTS

| | | |
|---|---|---|
| JP | 8-8654 | 1/1996 |
| JP | 8-23247 | 1/1996 |

* cited by examiner

*Primary Examiner*—Michael B Shingleton
(74) *Attorney, Agent, or Firm*—Armstrong, Westerman & Hattori, LLP

(57) ABSTRACT

A push-pull amplifier circuit includes a push-pull output circuit having a P-channel FET 11 and an N-channel FET 10 connected in series between supply potentials VDD and VSS, a gate potential difference circuit 16A having ends OP and ON connected to the gates of the FET 11 and FET 10, respectively, wherein the voltage VPN between OP and ON is adjusted depending on a control signal VG3, an input circuit 17 for changing potentials of OP and ON in response to an input voltage VI while keeping the voltage VPN between OP and ON substantially constant, a constant current source 40 for outputting a reference current IS, and an idle current detecting and comparing circuit 30 for detecting a current proportional to an idle current flowing through the FET 11 and FET 10 and generating a control signal VG3 for the circuit 16A so that the detected current approaches a reference current IS. In another configuration, there is provided a voltage control circuit for providing a potential VB=α·VA−β to the gate of the FET 11 in response to a potential VA provided to the gate of the FET 10, where α and β are predetermined values, and a constant current source connected in parallel to the FET 10 to flow the idle current.

19 Claims, 24 Drawing Sheets

PUSH-PULL AMPLIFIER CIRCUIT WITH IDLING CURRENT CONTROL

BACKGROUND OF THE INVENTION

1. Field of the Invention

The present invention relates to a push-pull amplifier circuit for amplifying an AC signal with controlling an idling current of its output stage.

2. Description of the Related Art

FIG. 20 shows a prior art push-pull amplifier of class AB, which is used, for example, in amplification of an audio signal and provides the amplified signal to a speaker. When the push-pull amplifier is used, for example, in mobile electronic equipment such as a portable telephone, high power efficiency and the lowest possible power consumption are demanded.

In the output stage of the circuit, an N-channel FET 10 and a P-channel FET 11 are connected in series between a conductor having a power supply potential VDD and a conductor having a power supply potential VSS. Currents IP and IN flowing through the transistors 10 and 11 are determined by gate potentials VG1 and VG2 of the transistors 10 and 11, respectively.

In the input stage of the circuit, a constant current source 12, an N-channel FET 13, a P-channel FET 14, and an N-channel FET 15 are connected in series between the conductor having the potential VDD and the conductor having the potential VSS.

The gate and drain of the N-channel FET 13 are mutually connected and the gate of the N-channel FET 13 is connected to the gate of the N-channel FET 10. The gate and drain of the P-channel FET 14 are mutually connected and the gate of the P-channel FET 14 is connected to the gate of the P-channel FET 11. A voltage between the gate and source of the N-channel FET 13 is substantially equal to the threshold voltage Vthn thereof and a voltage between the gate and source of the P-channel FET 14 is substantially equal to the threshold voltage Vthp thereof. Accordingly, a difference (VG1−VG2) between the gate potentials VG1 and VG2 of the transistors 10 and 11 is substantially constant independently of an input potential VI, having a signal and a bias voltage components, that is applied to the gate of the N-channel FET 15. The transistors 13 and 14 constitute gate potential difference circuit 16.

By means of the constant current source 12, a substantially constant current ID flows through the between-gate potential difference circuit 16 and the N-channel FET 15. The voltage VD between the source and drain of the constant current source 12 changes depending on the gate potential VI of the N-channel FET 15, and VG1=VDD−VD is determined by VD. The constant current source 12 and the N-channel FET 15 constitute an input circuit 17.

With rise in the input voltage VI from a value, the drain current ID of the constant current source 12 is going to increase, and the voltage VD between the source and drain of the constant current source 12 rises (see FIG. 21(A)). Thereby, the gate potentials VG1 and VG2 each fall, resulting in decreasing in the current IP, increasing in the current IN and falling in output voltage VO.

One end of a load 18 is connected to a node between the N-channel FET 10 and the P-channel FET 11, and the other end thereof is connected to a conductor having a power supply potential, for example, (VDD+VSS)/2. A current IL=IP−IN flows through the load 18. When IP>IN, that is IL>0, an idle current flowing from VDD through the transistors 10 and 11 to VSS is equal to IN. When IP<IN, that is IL<0, an idle current flowing from VDD through the transistors 10 and 11 to VSS is equal to IP. Relations of each of the current IP and IN with the input voltage VI are as shown in FIG. 21(B).

The idle current is required to have a magnitude at some extent in order to improve a linearity of the output signal with the input signal. The idle current generally tends to increase as the output current IL decreases (FIG. 21(B)). Further, since the idle current changes depending on deviations of process in device fabrication and of temperature in operating, the minimum idle current has to be ensured in design so as to be more than a predetermined value in the worst conditions conceivable. Therefore, according to conditions, wasteful idle current flows which causes increase in power consumption. Especially, an idle current in the output stage of a push-pull amplifier cannot be neglected because its magnitude is rather large.

In order to decrease the idle current, in a push-pull amplifier disclosed in JP 96-23247A, the idle current is detected in a monitoring part having current mirror circuits, its detected value is compared with a current of a constant current source and the idle current is controlled so as to be of a predetermined value in response to the compared result.

In the output stage of that push-pull amplifier, as shown in FIG. 22, an N-channel FET 10 and a P-channel FET 11 are connected between conductors having a power supply potentials VDD and VSS in series in the order reverse to the case of FIG. 20. The P-channel FET 11 and a P-channel FET 14 whose gate and drain are connected mutually constitute a current mirror circuit, and therefore a voltage between the source and gate of the P-channel FET 14 is substantially equal to the threshold voltage Vthp thereof. Likewise, the N-channel FET 10 and an N-channel FET 13 whose gate and drain are connected mutually constitute a current mirror circuit and therefore, a voltage between the source and gate of the N-channel FET 13 is substantially equal to the threshold voltage Vthn thereof. For example, in a case where the power supply voltage (VDD−VSS) is 3.0 V and the threshold voltages Vthp and Vthn are both 0.5 V, a potential difference between the gates of the transistors 11 and 10 are approximately 3.0−0.5×2=2.0 V regardless of an input signal.

However, when the power supply voltage (VDD−VSS) changes, the potential difference between the gates of the transistors 11 and 10 changes in a slave manner following the change in the power voltage (VDD−VSS). Therefore it becomes hard to control the idle current so as to be a predetermined value.

Further, letting $\mu$=(W/L of the transistor 11)/(W/L of the transistor 14), where a gate width is W and a gate length is L, the maximum value of the current IP flowing through the transistor 11 is limited to a value of $\mu$ times the maximum current flowing through the transistor 14. Since a size of the transistor 11 has a limit on its size, the maximum value of the current IP is also limited to a value under the limitation on the size. This limitation applies to the current IN as well.

Referring back to the push-pull amplifier of FIG. 20, the current IP is controlled by the voltage between the gate and source of the N-channel FET 10. However, with rising in the gate potential VG1, an output voltage VO also rises. Therefore, the voltage between the gate and source is approximately equal to the threshold voltage Vthn of the N-channel FET 10, resulting in that the maximum value of the current IP is limited. This limitation also applies to the current IN.

In addition, in the push-pull amplifier of FIG. 20, the maximum amplitude of the output voltage VO is limited in the following way. That is, since a relation VO≈VDD−VD−Vthn holds, the minimum value of the source-drain voltage VD with which a constant current source 12 can function is, for example, of about 0.1 V and the threshold voltage Vthn is of about 0.5 V, therefore, the maximum value of the output voltage VO is of about (VDD−0.6) V. In this maximum state, since a source potential of the N-channel FET 10 is much higher than the power supply voltage VSS, the threshold voltage Vthn is higher due to a substrate bias effect, which causes a further fall in the maximum value of the output voltage VO. Since the push-pull amplifier is substantially symmetrical with respect to the middle potential between the power supply potentials VDD and VSS, likewise the minimum value of the output voltage VO is of about (VSS+0.6) V, resulting in that the maximum amplitude of the output voltage VO is limited especially when VDD is low.

Next, another problem of a push-pull amplifier will be described.

FIG. 23 shows an operational amplifier circuit, which is disclosed in JP 96-8654A, comprising a differential amplifier 50 and a class AB push-pull amplifier 60X in the succeeding stage. This operational amplifier circuit is used in amplifying, for example, an audio signal provided to a speaker.

In a case where the operational amplifier is used in mobile electronic equipment such as a portable telephone, there arise demands for high power efficiency and as small power consumption as possible. Further, in a case of being used in small sized mobile electronic equipment, since a current drive capability is relatively low, increase therein is required.

In a push-pull output circuit 61 of the amplifier 60X, transistors 11 and 10 are connected in series between conductors having power supply potentials VDD and VSS. The output voltage VA of the differential amplifier 50 is provided to the gate of the transistor 11 while the voltage VB generated by a control circuit 62 in response to the voltage VA is provided to the gate of the transistor 11.

In the control circuit 62, T1 and T4 each are P-channel FETs and T2, T3 and T5 each are N-channel FETS.

The transistors T2 and T3 constitutes a current mirror circuit and the current I3 flowing through the transistor T3 is proportional to the current I1 flowing through the transistor T2. If the proportional coefficient which is determined by transistor size is 1, a relation I3=I1 holds. The transistor T4 constitutes a constant current source whose gate is applied with a constant voltage VB0 and the constant current I4 thereof is equal to a sum of the current I3 flowing through the transistor T3 and the current I5 flowing through the transistor T5. Therefore, a relation I5=I4−I1 holds. Further, the transistors T5 and 10 constitute a current mirror circuit, the current IN flowing through the transistor 10 is proportional to the current I5, and letting the proportional coefficient be k, a relation IN=k·I5 holds. Therefore, the following equation holds.

$$IN=k \cdot (I4-I1) \quad (1)$$

A load 18 and a DC power supply 19 are connected in series between an output node, which is between the transistors 11 and 10, and the conductor having the power supply potential VSS.

FIG. 24 shows the relation of the voltage VA with each of the currents IN and IP. The relation between the voltages VA and VB is determined by the control circuit 62, and the current IN is one when the voltage VB depending on the VA is applied to the gate of the transistor 10.

At a point VA=VSG in FIG. 24, the current IP flowing through the transistor 11 and the current IN flowing through the transistor 10 are equal to each other, and thereby a current flowing through the load 18, that is, output current, is zero.

As the voltage VA rises from stable biased voltage in which the output current is zero, the current IP decreases. While the current I1 decreases, and thereby the current IN increases according to the above described equation (1). Therefore, a current (IN−IP) flows from the load 18 to the amplifier 60X.

As the voltage VA falls from that stable biased voltage, the current IP increases. While the current I1 increases, and thereby the current IN decreases according to the equation (1). Therefore, the current (IP−IN) flows from the amplifier 60x to the load 18.

An idle current Iidl flowing through the transistors 11 and 10 has a value Min (IP, IN) which means a smaller one of the currents IP and IN. As described above, the value becomes the maximum Im when the output current is zero.

Denoting the minimum and maximum of the current I1 as I1max and I1min, respectively, the maximum Imax and minimum Imin of the current IN are respectively expressed by the following equations derived from the above equation (1).

$$Imax=k \cdot (I4-I1min) \quad (2)$$

$$Imin=k \cdot (I4-I1max) \quad (3)$$

As Imax is larger, a load drive capability is higher, while as Imin is smaller, the idle current Iidl is smaller.

However, if a value of k or I4 is increased in order to improve the load drive capability, Imin also increases, thereby increasing the idle current Iidl. Contrary to this, if a value of k or I4 is decreased in order to decrease the idle current Iidl, Imax decreases, thereby lowering the load drive capability. That is, improvement of the load drive capability and decrease in the idle current are incompatible requirements with each other.

SUMMARY OF THE INVENTION

Accordingly, it is an object of the present invention to provide a push-pull amplifier circuit that can expand an output current range.

It is another object of the present invention to provide a push-pull amplifier circuit that can expand an output voltage range.

It is a further object of the present invention to provide a push-pull amplifier circuit that can achieve both to improve load drive capability and to reduce in an idle current.

Hereinafter, the term merely "signal" means a voltage signal or a current signal.

In the first aspect of the present invention, as shown in FIG. 1 for example, there is provided a push-pull amplifier circuit comprising: a push-pull output circuit having first and second transistors (11 and 10) connected in series between first and second power supply potentials, a conductivity of the second transistor being opposite to that of the first transistor, each of the first and second transistors having a control input; a control input potential difference circuit (16A) having first and second ends (OP and ON) being connected to the control inputs of the first and second transistors and a control input for receiving a control signal (VG3) to adjust a voltage between the first and second ends in response to the control signal; and an input circuit (17) for changing potentials of the first and second ends in response to an input signal with keeping the voltage substantially constant. With the first aspect of the present invention, it is not necessary to connect a transistor in diode connection between the control input of the first transistor and the first or second power supply potential, that is, between the gate and source of the first transistor or between the base and emitter of the first transistor, and it is not necessary to connect a transistor in diode connection between the control input of the second transistor and the second or first power supply potential, that is, between the gate and source of the second transistor or between the base and emitter of the second transistor.

Further, because the output of the amplifier is obtained from the drains or collectors of the first and second transistors, the minimum of the absolute value of the difference between the output potential and the first power supply potential or the absolute value of the difference between the output potential and the second power supply potential can be reduced down to about 0.1 V.

Accordingly, limitations on potential range at the control inputs of the first and second transistors can be alleviated, and as a result, the output current range and the output voltage range of the push-pull amplifier circuit can be expanded.

In the second aspect of the present invention, as shown in FIG. 11 for example, there is provided a push-pull amplifier circuit comprising: a push-pull output circuit having first and second transistors (11 and 10) connected in series between first and second power supply potentials, a conductivity of the second transistor being opposite to that of the first transistor, the first transistor having a control input for receiving an input signal, the second transistor having a control input for receiving a control signal; a control circuit for, in response to the input signal VA, generating the control signal VB by multiplying the input signal VA by α and shifting the multiplied input signal α·VA by –β, wherein a is a substantially predetermined positive value and β is a substantially predetermined value having a sign same as that of ((the input signal)–(the control signal)).

The current I flowing through the second transistor is substantially expressed by the following equations.

$$I = gm(VB - Vth) \text{ for } VB > Vth \quad (4)$$

$$I = 0 \text{ for } VB < Vth \quad (5)$$

Herein, gm designates the transconductance of the second transistor, and Vth designates the threshold voltage of the second transistor.

The following equation holds in the above second aspect.

$$VB = \alpha \cdot VA - \beta \quad (6)$$

When this equation is substituted into the equation (4), the following equation is obtained.

$$I = gm \cdot (VA - (\beta + Vth)/\alpha) \quad (7)$$

In actual fact, in order to properly reduce a cross-over distortion, circuit design is performed so that the minimum of I may be a small positive value that is not zero.

By selecting a properly large value of α, the current drive capability can be improved according to the equation (7). Further, by selecting a proper value of β together with this proper large value of α, it is possible to set VB at VB=Vth in the equation (4), that is, at VA=(β+Vth)/α in the equation (7), whereby I=0.

With the second aspect of the present invention, both improvement of the load drive capability and reduction in an idle current can be achieved.

In the third aspect of the present invention, there is provided a push-pull amplifier circuit as defined in the second aspect, as shown in FIG. 9 for example, further comprising a constant current source connected in parallel to the second output transistor, wherein the α and β have such values that a current flowing through the second transistor is substantially zero when a current flowing through the first transistor is larger than a minimum value with a load being operably connected to the push-pull output circuit.

In this case, letting the current of the constant current source be IO, equations corresponding to the above equations (4) and (5) are expressed as follows.

$$I = gm(VB - Vth) + IO \text{ for } VB > Vth \quad (8)$$

$$I = 0 \text{ for } VB < Vth \quad (9)$$

Thus, as shown in FIG. 10, when VB<Vth, no current flows through the load and the idle current IO flowing through the first transistors can be made constant. In addition to this, the idle current 10 can be determined independently of the maximum value Imax of I. Accordingly, not only improvement of the load drive capability and decrease in the idle current simultaneously can be attained in an effective manner, but also circuit design can be easier.

Other aspects, objects, and the advantages of the present invention will become apparent from the following detailed description taken in connection with the accompanying drawings.

DESCRIPTION OF THE PREFERRED EMBODIMENTS

Figure 1:
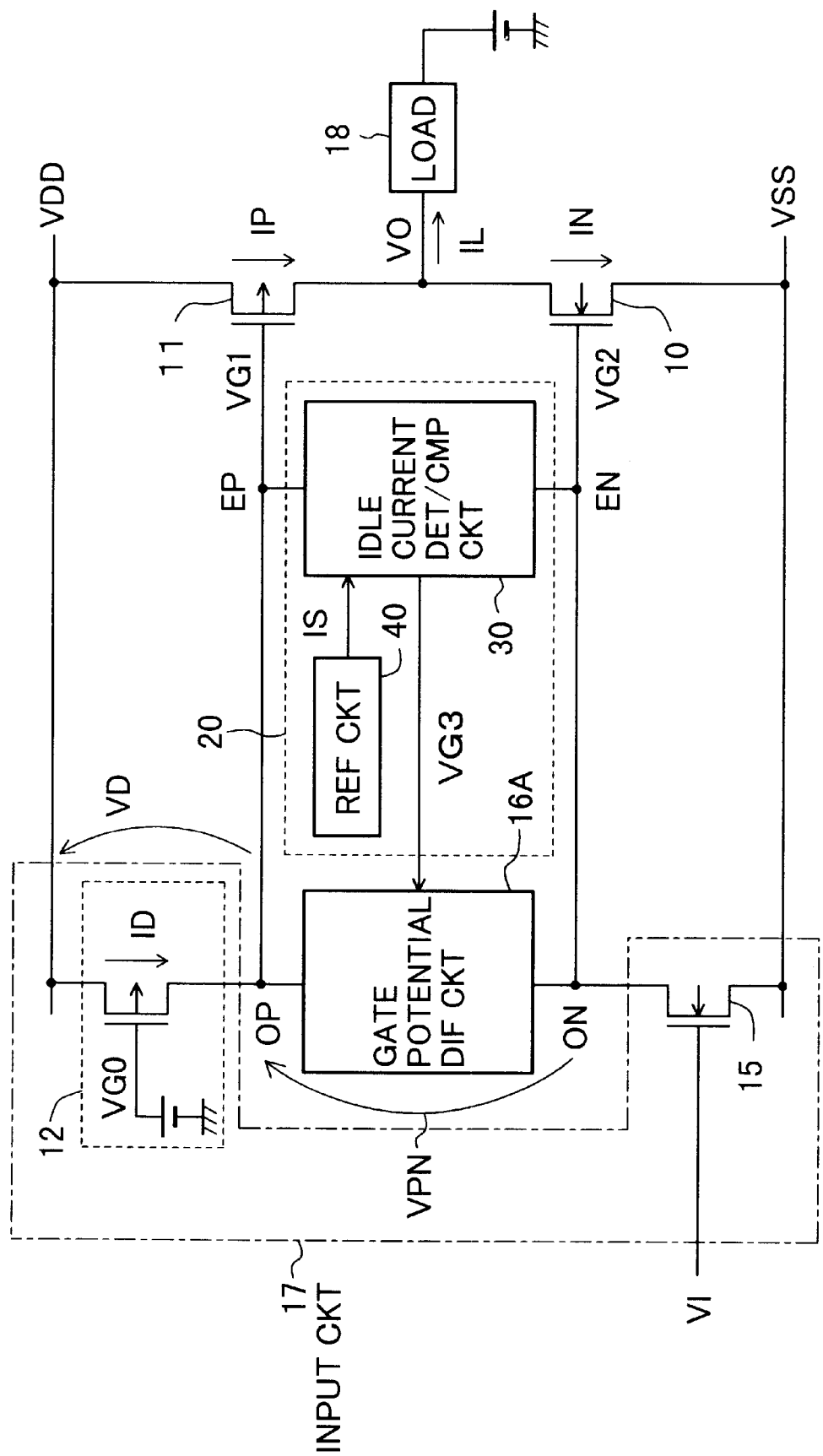
FIG. 1 is a schematic circuit diagram showing a push-pull amplifier of the first embodiment according to the present invention.

Referring now to the drawings, wherein like reference characters designate like or corresponding parts throughout several views, preferred embodiments of the present invention are described below.

First Embodiment

FIG. 1 shows a push-pull amplifier of class AB of a first embodiment according to the present invention. This circuit is incorporated, for example, into an integrated circuit and used in application for mobile electronic equipment such as a portable telephone. Hereinafter, "FET" designates MOSFET, a junction FET or the like.

Figure 22:
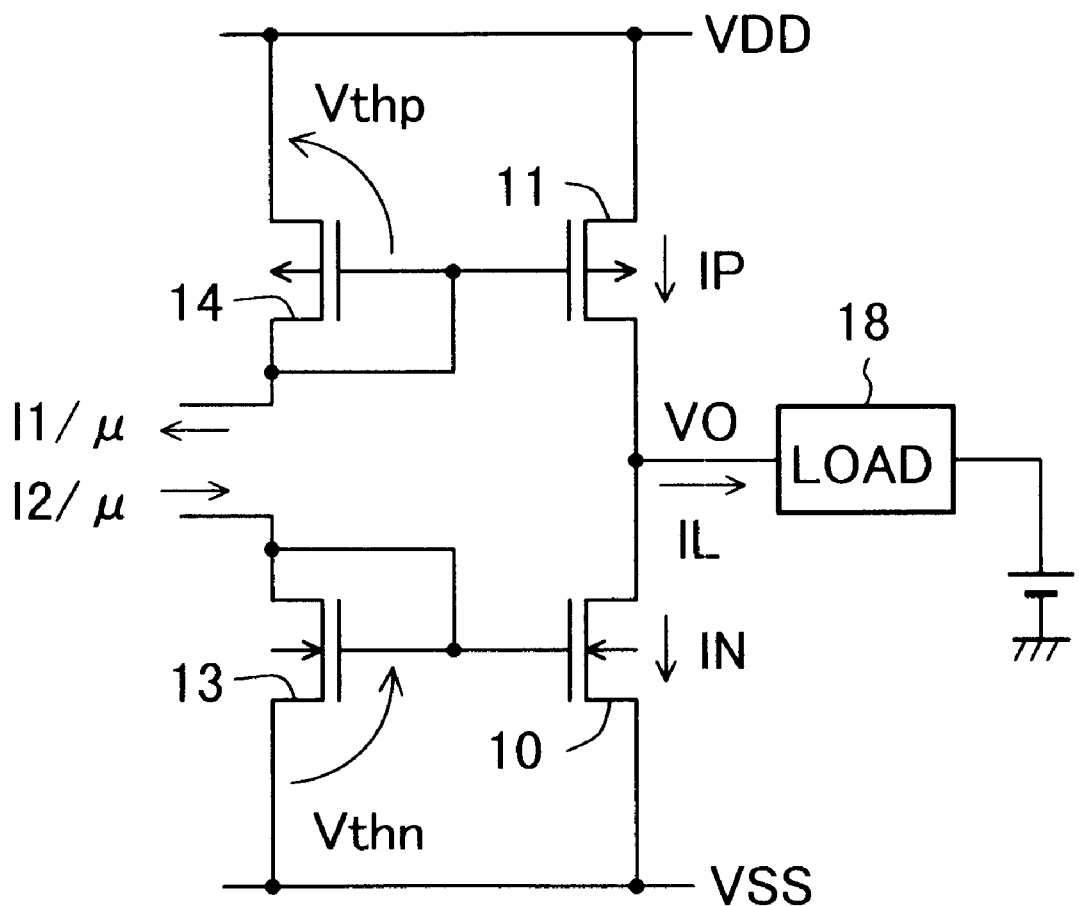
FIG. 22 is a circuit diagram showing the output stage of another prior art push-pull amplifier.
Figure 23:
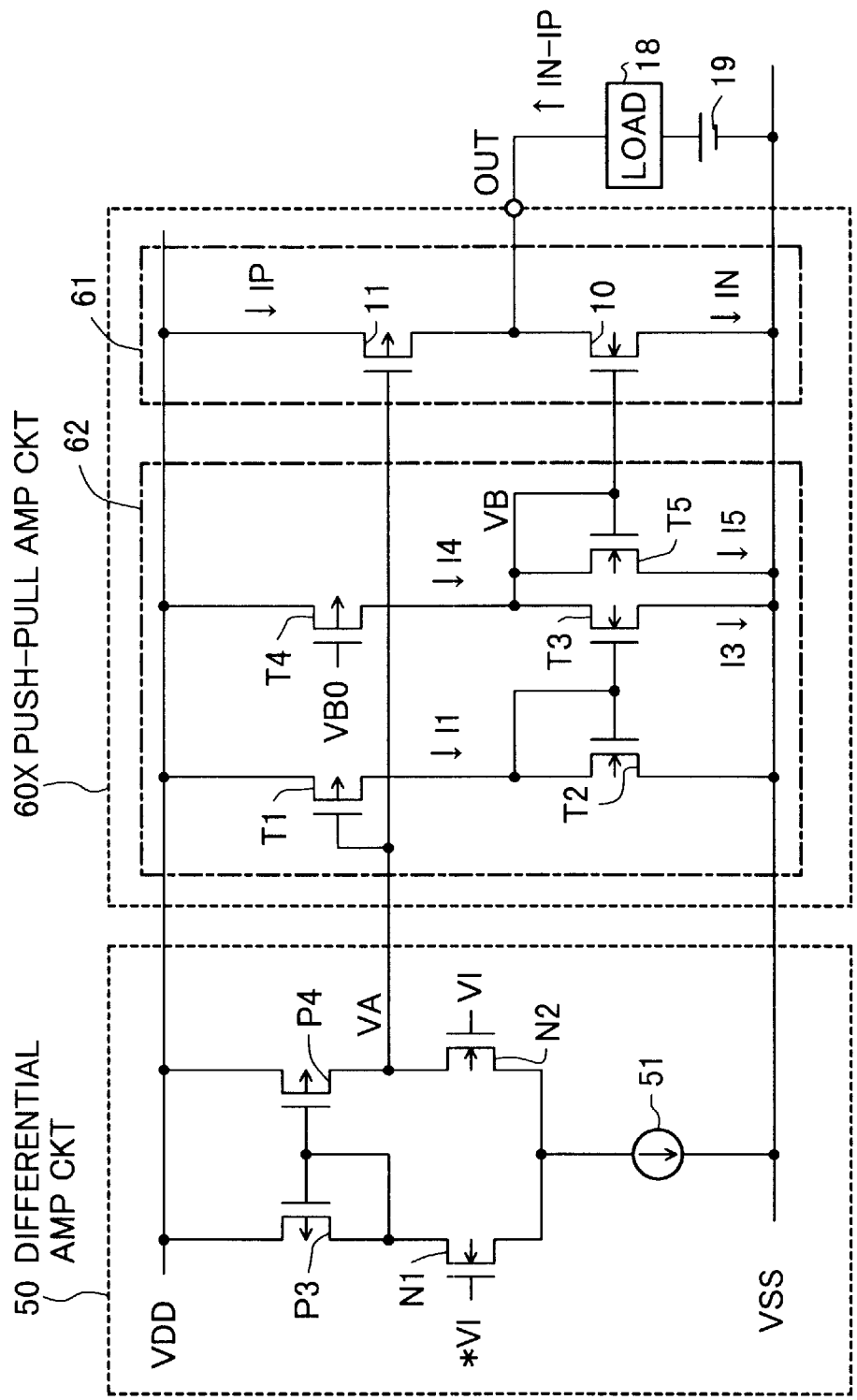
FIG. 23 is a circuit diagram showing a prior art operational amplifier.
Figure 24:
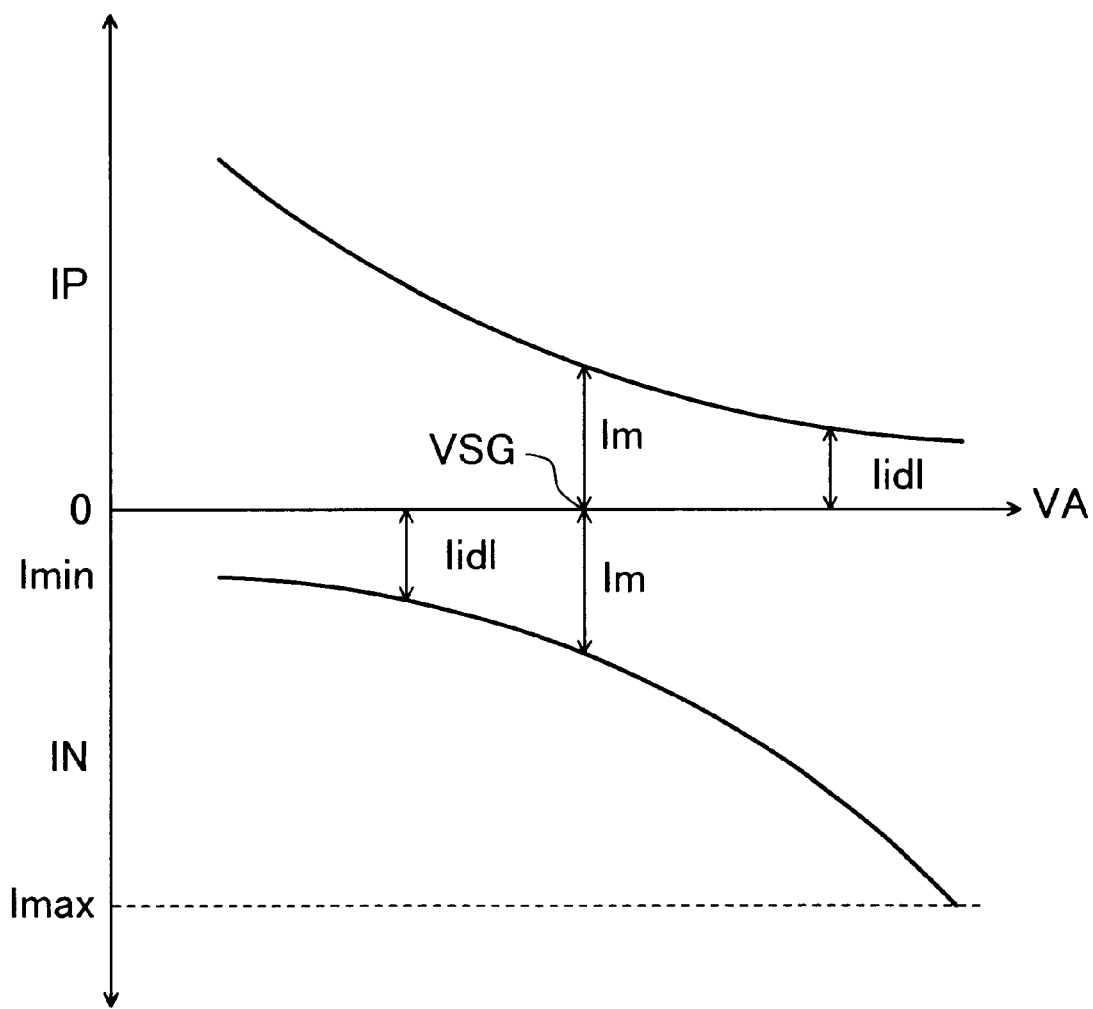
FIG. 24 is a graph showing voltage-current characteristics of the push-pull output circuit in FIG. 23.

In the output stage of this circuit, as same as FIG. 22, the N-channel FET 10 is on a power supply potential VSS side and the P-channel FET 11 is on a power supply potential VDD side, wherein VDD>VSS. The input circuit 17 is same as that in FIG. 20.

A gate potential difference circuit 16A connected between the constant current source 12 and the N-channel FET 15 has a substantially constant voltage between the outputs OP and ON when a substantially constant current flows therethrough, and the voltage can finely be adjusted by a gate potential difference adjusting circuit 20. The output OP is connected to the gate of a P-channel FET 11, and the output ON is connected to the gate of an N-channel FET 10.

For example, the power supply potentials VDD and VSS are respectively 3.0 V and 0 V, and the current flowing through the N-channel FET 15 is 1 mA, 1.5 mA or 0.5 mA when the amplitude of the AC component of an input voltage VI (superposition of an AC signal component and a DC bias component) is 0, the maximum or the minimum, respectively.

Figure 21A:
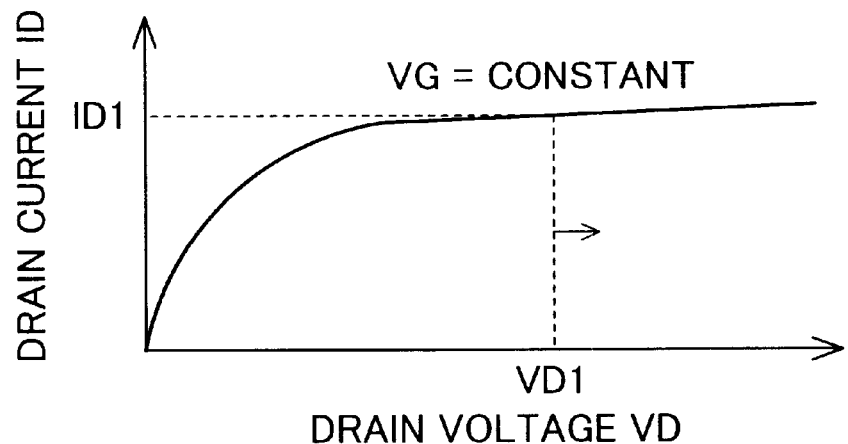
FIG. 21(A) is a graph showing drain voltage to drain current characteristics of FET with constant voltage applied to gate thereof.
Figure 21B:
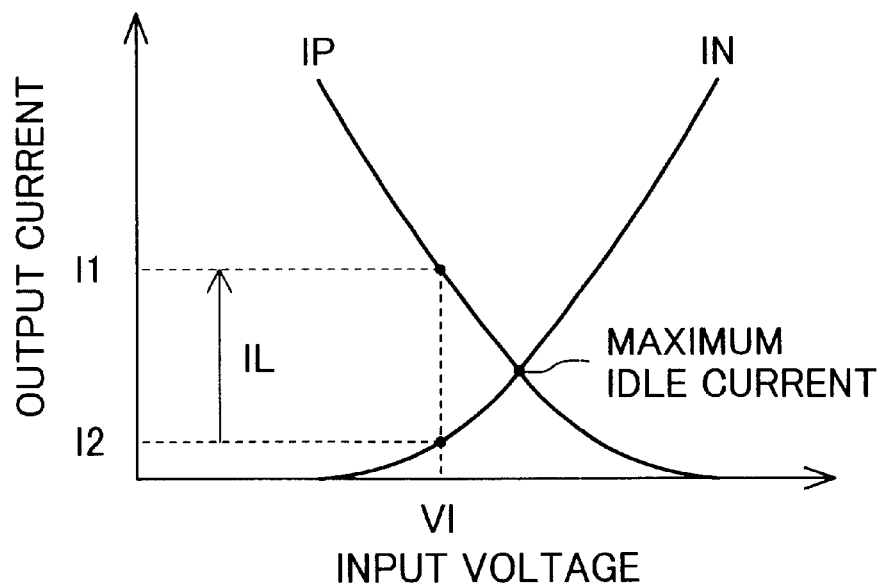
FIG. 21(B) is a graph showing voltage-current characteristics of the push-pull output circuit in FIG. 20.

With rise in the input voltage VI from a value, the drain current LD of the constant current source 12 is going to increase, and the voltage VD between the source and drain of the constant current source 12 rises (see FIG. 21(A)). Thereby, the gate potentials VG1 and VG2 each fall, the internal resistance of the P-channel FET 11 decreases and the internal resistance of the N-channel FET 10 increases, resulting in increasing in the current IP, decreasing in the current IN and rising in the output voltage VO.

Contrary to this, with fall in the input voltage VI from a value, the drain current ID of the constant current source 12 is going to decrease, and the voltage VD between the source and drain of the constant current source 12 falls. Thereby, the gate potentials VG1 and VG2 each rise, the internal resistance of the P-channel FET 11 increases and the internal resistance of the N-channel FET 10 decreases, resulting in decreasing in the current IP, increasing in the current IN and falling in the output voltage VO.

Next, the upper limit of the output voltage VO will be considered. In this state, the gate potentials VG1 and VG2 are at the lowest level. On one hand, because the N-channel FET 10 comes close to a cut off state current IN is as small as almost negligible. On the other hand, the current increases up to the maximum. The upper limit of the output voltage VO is not limited by the gate potential VG1. However, some voltage which is minimum is required between the source and drain of the P-channel FET 11 in order to make the current IP flow. The voltage is substantially equal to the minimum voltage VD, which is about 0.1 V, between the drain and source required in order that the constant current source 12 functions.

Figure 20:
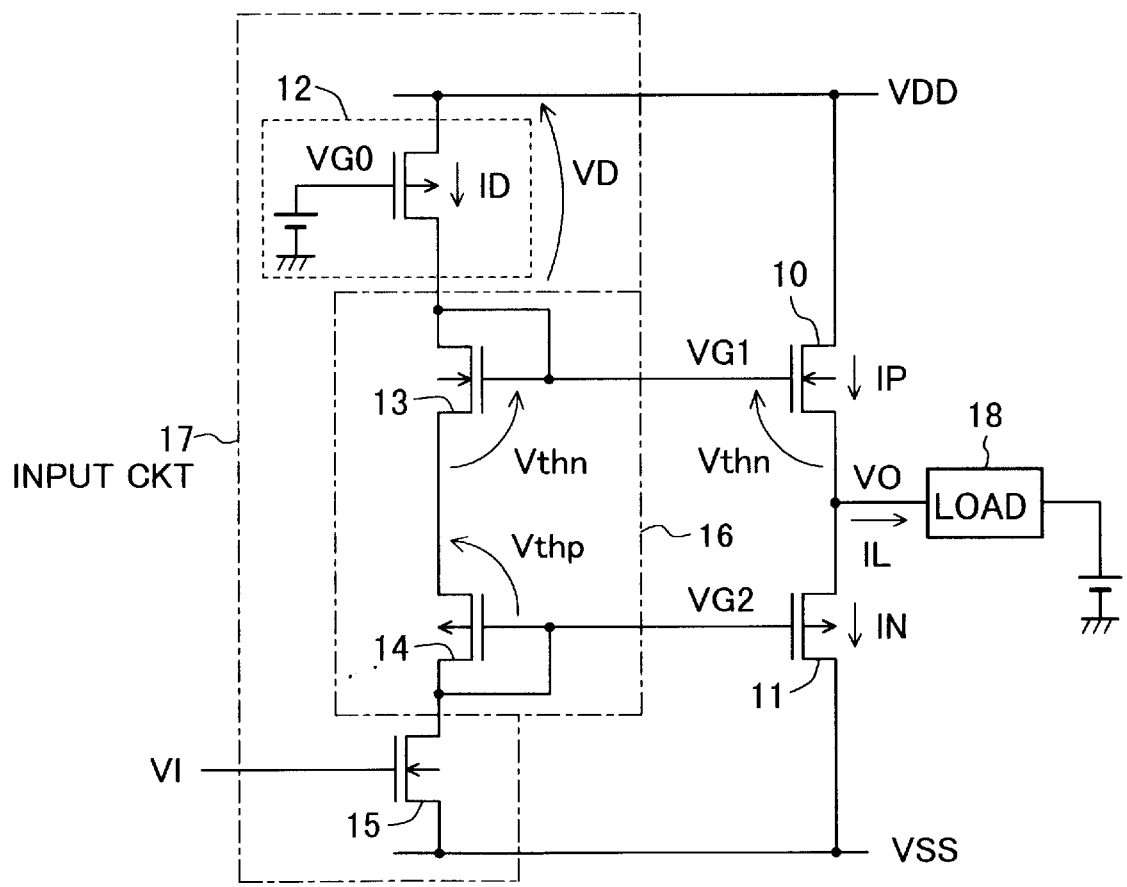
FIG. 20 is a circuit diagram showing a prior art push-pull amplifier.

Therefore, as compared with the circuit of FIG. 20, the upper limit of the output voltage is raised by a threshold voltage Vth, for example, 0.8 V, which is higher due to a substrate bias effect than the threshold voltage, for example, 0.5 V, in a normal state. Likewise, the lower limit of the output voltage VO falls by, for example, 0.8 V. Further, since the minimum necessary voltage of (VG1−VG2) is about 0.1 V, VG1 can fall down to a value close to (VSS+0.1)V and thereby, the current IP can increase up to the upper limit of the characteristics which the P-channel FET 11 has.

By controlling the gate voltage VG3, the voltage between the outputs OP and ON of the gate potential difference circuit 16A, that is the voltage (VG1−VG2) between the gates, is kept substantially constant. Hence, adjustment operation by the gate potential difference adjusting circuit 20 for the gate potential difference circuit 16A is substantially not affected by rise in the power supply potential VDD.

Next, the gate potential difference adjusting circuit 20 will be explained.

The gate potential difference adjusting circuit 20 comprises an idle current detecting and comparing circuit 30, and a reference circuit 40 that provides a reference value to the circuit 30. Inputs EP and EN of the circuit 30 are respectively connected to the gates of the P-channel FET 11 and N-channel FET 10. The output of the idle current detecting and comparing circuit 30 is provided to the control input of the gate potential difference circuit 16A.

The circuit 30 detects the current Min (IP/$\mu$, IN/$\mu$) proportional to an idle current Min (IP, IN) that is a smaller one of the currents IP and IN flowing through the transistors 11 and 10, respectively, and compares the value Min (IP/$\mu$, IN/$\mu$) with an output current IS of the reference circuit 40, where $\mu$ is a constant that is determined in a step of circuit design and $\mu$>1. The circuit 30 controls the gate potential difference circuit 16A so that the detected idle current comes close to the reference value. Thereby a potential difference VPN between the outputs OP and ON is finely adjusted.

A more detailed description will be made. If Min (IP/$\mu$, IN/$\mu$)>IS, then the voltage difference VPN increases, whereby the gate potential VG1 rises or the gate potential VG2 falls. Hence, the current IP or IN decreases and Min (IP/$\mu$, IN/$\mu$) comes close to the reference current IS. Contrary to this, if Min (IP/$\mu$, IN/$\mu$)<IS, then the potential difference VPN decreases, whereby the gate potential VG1 falls or the potential VG2 rises. Therefore, the current IP or IN increases and the idle current Min(IP, IN) comes close to $\mu$·IS. Accordingly, the idle current Min(IP, IN) approaches $\mu$·IS.

Next, an embodiment of the gate potential difference circuit 16A and the gate potential difference adjusting circuit 20 will be described with reference to FIG. 2.

The gate potential difference circuit 16A consists of an N-channel FET as a variable load element.

In the idle current detecting and comparing circuit 30, a P-channel FET 31, N-channel FETs 32 and 33 are connected in series between the conductors having the power supply potentials VDD and VSS. The gates of the P-channel FET 31 and the N-channel FET 33 are respectively connected to the gates of the P-channel FET 11 and the N-channel FET 10 in FIG. 1, the transistors 31 and 11 constitute a current mirror circuit, and the transistors 33 and 10 also constitute a current mirror circuit. The W/L ratios of each of the transistors 31 and 33 are 1/$\mu$ times that of the transistors 11 and 10, respectively. A current IP/$\mu$ is going to flow through the P-channel FET 31, while a current IN/$\mu$ is going to flow through the N-channel FET 33. Since the transistors 31, 32 and 33 are connected in series, as a result, the current Min (IP/$\mu$, IN/$\mu$) which is a smaller one of the current IP/$\mu$ and IN/$\mu$, that is, a current proportional to the idle current Min (IP, IN) flows through the transistors 31, 32 and 33.

The reference circuit 40, and N-channel FETs 34 and 35 of the idle current detecting and comparing circuit 30 are connected in series between the power supply potentials VDD and VSS. The N-channel FET 32 is incorporated so as to make the current Min (IP/$\mu$, IN/$\mu$) flow through the N-channel FET 34, the gate and drain of the N-channel FET 32 are mutually connected and the gate of the N-channel FET 32 is connected to the gate of the N-channel FET 34. In order to make the N-channel FETs 32 and 34 function as an accurate current mirror circuit, the source potentials of the N-channel FETs 32 and 34 have to be equal to each other. The N-channel FET 35 is incorporated so as to meet such a condition in a corresponding manner to the N-channel FET 33. That is, the gate of the N-channel FET 35 is connected to the gate of the N-channel FET 10 in FIG. 1 and thereby, the transistor 35 and the transistor 10 constitute a current mirror circuit. Since the current Min (IP/$\mu$, IN/$\mu$) is going to flow through the N-channel FET 34 and the current IN/$\mu$ is going to flow through the N-channel FET 35, the current Min (IP/$\mu$, IN/$\mu$) that is smaller one of the current IP/$\mu$ and IN/$\mu$ actually flows through the N-channel FETs 34 and 35.

The reference circuit 40 is a constant current source, is configured in the same way as in the constant current source 12 in FIG. 1, and is going to provides a reference current IS.

The gate of the N-channel FET 16A is connected to the node between the constant current source 40 and the N-channel FET 34, and the potential VG3 of the gate of the N-channel FET 16A changes in the following way.

If IS<Min (IP/$\mu$, IP/$\mu$), then the reference current IS is going to increase, and thereby the voltage between the drain and source of the constant current source 40 rises (see FIG. 21(A)). Therefore, the gate voltage VG3 falls, and the internal resistance of the N-channel FET 16A increases. Hence, the gate potential VG1 in FIG. 1 rises or the gate potential VG2 falls, the idle current Min (IP, IN) decreases, and Min (IP/$\mu$, IN/$\mu$) comes close to the reference current IS. Contrary to this, if IS>Min (IP/$\mu$, IN/$\mu$), then the reference current IS is going to decrease, and thereby the voltage between the drain and source of the constant current source 40 falls. Therefore, the gate voltage VG3 rises, and the internal resistance of the N-channel FET 16A decreases. Hence, the gate potential VG1 in FIG. 1 falls or the gate potential VG2 rises, the idle current Min (IP, IN) increases, and Min (IP/$\mu$, IN/$\mu$) comes close to the reference current IS.

In such a manner, the idle current Min(IP, IN) is controlled so as to be the reference current IS.

In order to reduce power consumption, the idle current (bias current) is preferably set to the minimum that can realizes a satisfactory operation of a push-pull amplifier, and such a minimum current is selected in a design step.

Second Embodiment

Figure 3:
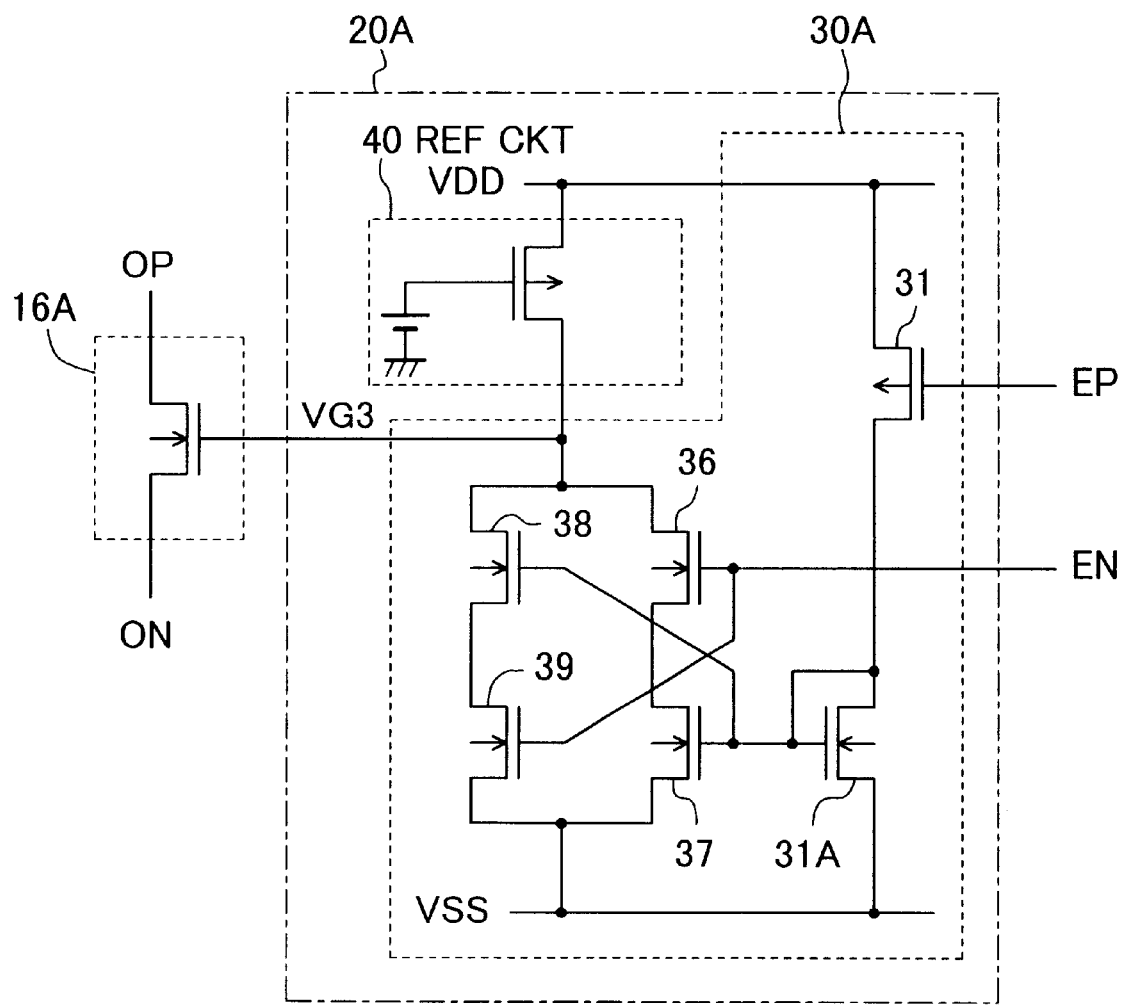
FIG. 3 is a diagram showing a gate potential difference and its adjusting circuit of a second embodiment according to the present invention.

FIG. 3 shows a gate potential difference and its adjusting circuit of the second embodiment according to the present invention, incorporated in the push-pull amplifier of FIG. 1.

In an idle current detecting and comparing circuit 30A, the P-channel FET 31 and an N-channel FET 31A are connected in series between the power supply potentials VDD and VSS, and the current flowing through the P-channel FET 31 is made to flow through the N-channel FET 31A. The gate of the P-channel FET 31 is connected to the P-channel FET 11 in FIG. 1, the P-channel FET 31 and the P-channel FET 11 constitute the current mirror circuit and the current IP/$\mu$ flows through the P-channel FET 31.

Between the power supply potentials VDD and VSS, the constant current source 40, and N-channel FETs 36 and 37 of the circuit 30A are in series connected, and the constant current source 40, and N-channel FETs 38 and 39 are also in series connected. The gates of the transistors 31A and 37 are mutually connected and the gate and drain of the transistor 31A are mutually connected, whereby the N-channel FETs 31A and 37 constitute a current mirror circuit. Assuming that the transfer ratio of the current mirror circuit consisting of the transistors 31A and 37 is equal to 1, the current IP/$\mu$ is going to flows through the transistor 37. The gate of an N-channel FET 39 is connected to the gate of the N-channel FET 10 in FIG. 1 and the N-channel FETs 10 and 39 constitute a current mirror circuit. In such a configuration, the current IN/$\mu$ is going to flows through the N-channel FET 39.

Besides, the gates of the transistors 31A and 38 are mutually connected to constitute an imperfect current mirror circuit, while the gates of the N-channel FET 36 and the N-channel FET 10 in FIG. 1 are mutually connected to constitute an imperfect current mirror circuit. Hence, currents of substantially equal to IP/$\mu$ and IN/$\mu$ is going to respectively flow through the transistors 38 and 36. Since the transistors 36 and 37 are connected in series to each other, an almost Min(IP/$\mu$, IN/$\mu$) actually flows through the transistors 36 and 37. Similarly, since the transistors 38 and 39 are in series connected in series to each other, an almost Min(IP/$\mu$, IN/$\mu$) actually flows through the transistors 38 and 39. Therefore, a current Min(IP/$\mu$, IN/$\mu$) proportional to the idle current Min(IP, IN) flows between the constant current source 40 and the power supply potential VSS like in the case of FIG. 2.

Cross connection and operations of the N-channel FETs 36 to 39 are same as that of U.S. Pat. No. 5,606,287.

Figure 2:
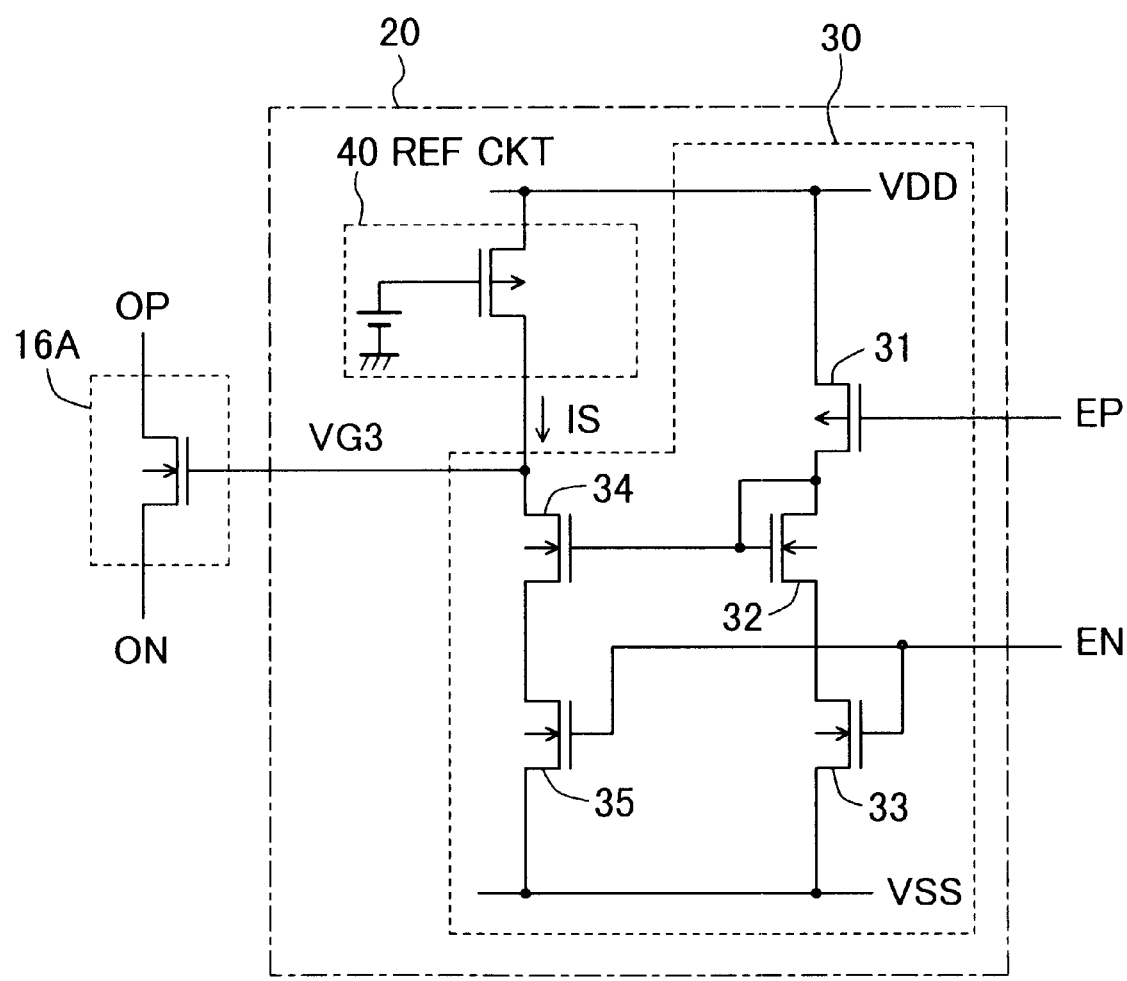
FIG. 2 is a diagram showing a gate potential difference and its adjusting circuit in FIG. 1.

Since, in FIG. 2, the source potentials of the N-channel FETs 32 and 34 are not accurately same as each other, the current mirror circuit consisting thereof is imperfect. However, in FIG. 3, since such inaccuracy are made even in a direction for errors to be reduced, the idle current of the push-pull output circuit is more correctly controlled so as to be $\mu$·IS than in the case of FIG. 2.

Third Embodiment

Figure 4:
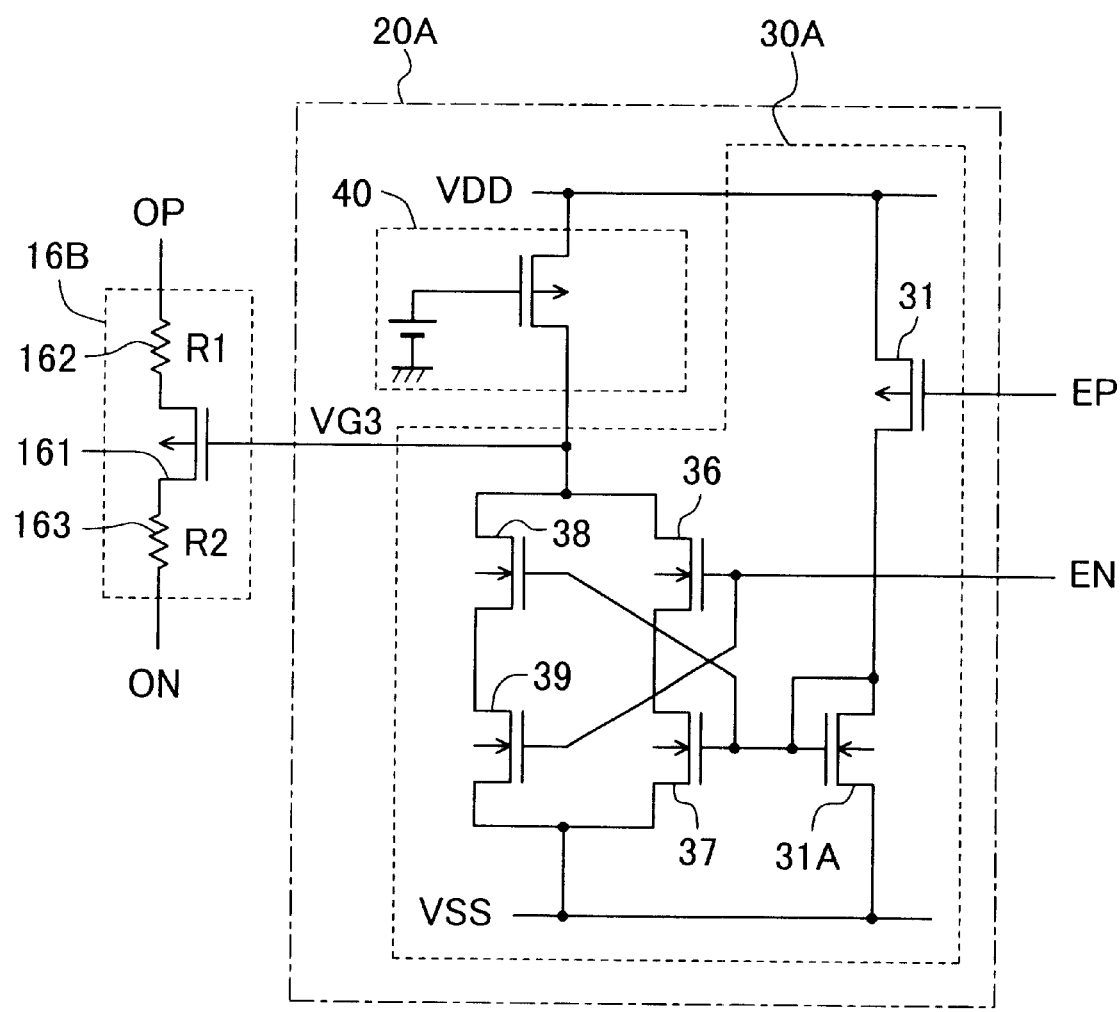
FIG. 4 is a diagram showing a gate potential difference and its adjusting circuit of a third embodiment according to the present invention.

FIG. 4 shows a gate potential difference and its adjusting circuit of the third embodiment according to the present invention, incorporated in the push-pull amplifier of FIG. 1.

In the gate potential difference circuit 16B, resistors 162 and 163 are respectively connected to the source and drain of a P-channel FET 161, and the gate potential VG3 of the P-channel FET 161 is controlled by the gate potential difference adjusting circuit 20A. Letting the resistance of the resistors 162 and 163 be R1 and R2, respectively, circuit design is made so as to satisfy a relation (the internal resistance of the P-channel FET 161)<<(R1+R2) when the drain current ID flows through the P-channel FET 161.

Design parameters are determined so that when the gate potential VG3 of the P-channel FET 161 falls to decrease the internal resistance of the transistor 161 and to increase the drain current ID by a small amount $\Delta$ID, $\Delta$ID·(R1+R2) is larger than a fall in voltage between the source and drain of the P-channel FET 161. Hence, when the gate potential VG3 falls, the gate potential VG1 in FIG. 1 rises, the gate potential VG2 falls and the idle current Min(IP, IN) decreases. When the gate potential VG3 rises, operation reverse to the above-described one is performed.

In such a manner, the idle current Min(IP, IN) is controlled so as to be $\mu$·IS.

Fourth Embodiment

Figure 5:
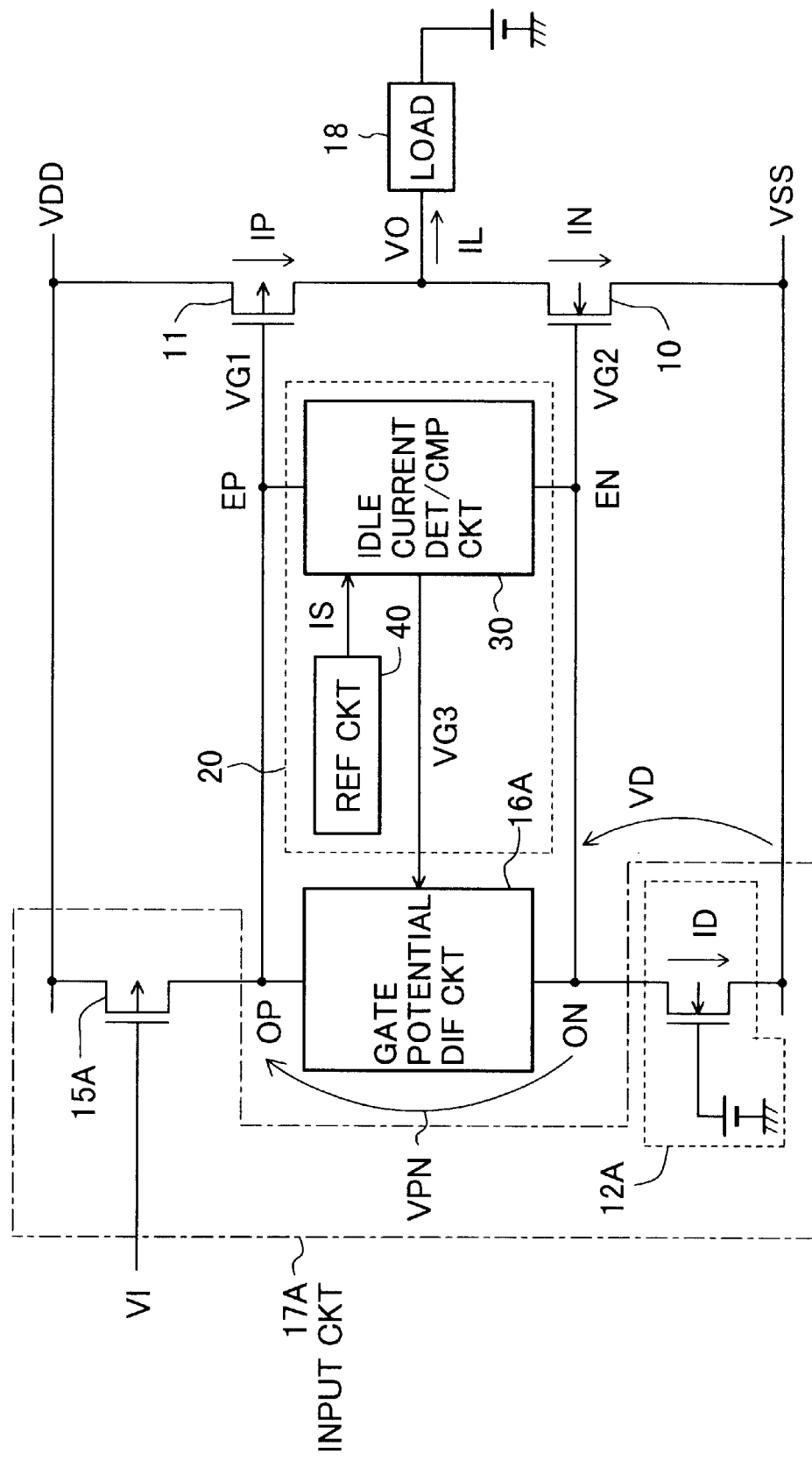
FIG. 5 is a schematic circuit diagram showing a push-pull amplifier of the fourth embodiment according to the present invention.

FIG. 5 shows a class AB push-pull amplifier of the fourth embodiment according to the present invention.

The configuration of the input circuit 17A is such that in FIG. 1, the constant current source 12 and the FET 15 are interchanged to each other and the conductivity types of the constant current source 12 and the FET 15 are changed.

The relation in phase between the AC signal component in the input voltage VI and that of the output voltage VO is same as the case of FIG. 1.

It should be noted that the gate potential difference adjusting circuit 20 is not limited to the circuit 20 in FIG. 2, but may be the circuit 20A of FIG. 3 or a circuit 20B of FIG. 6 to be explained below.

Fifth Embodiment

Figure 6:
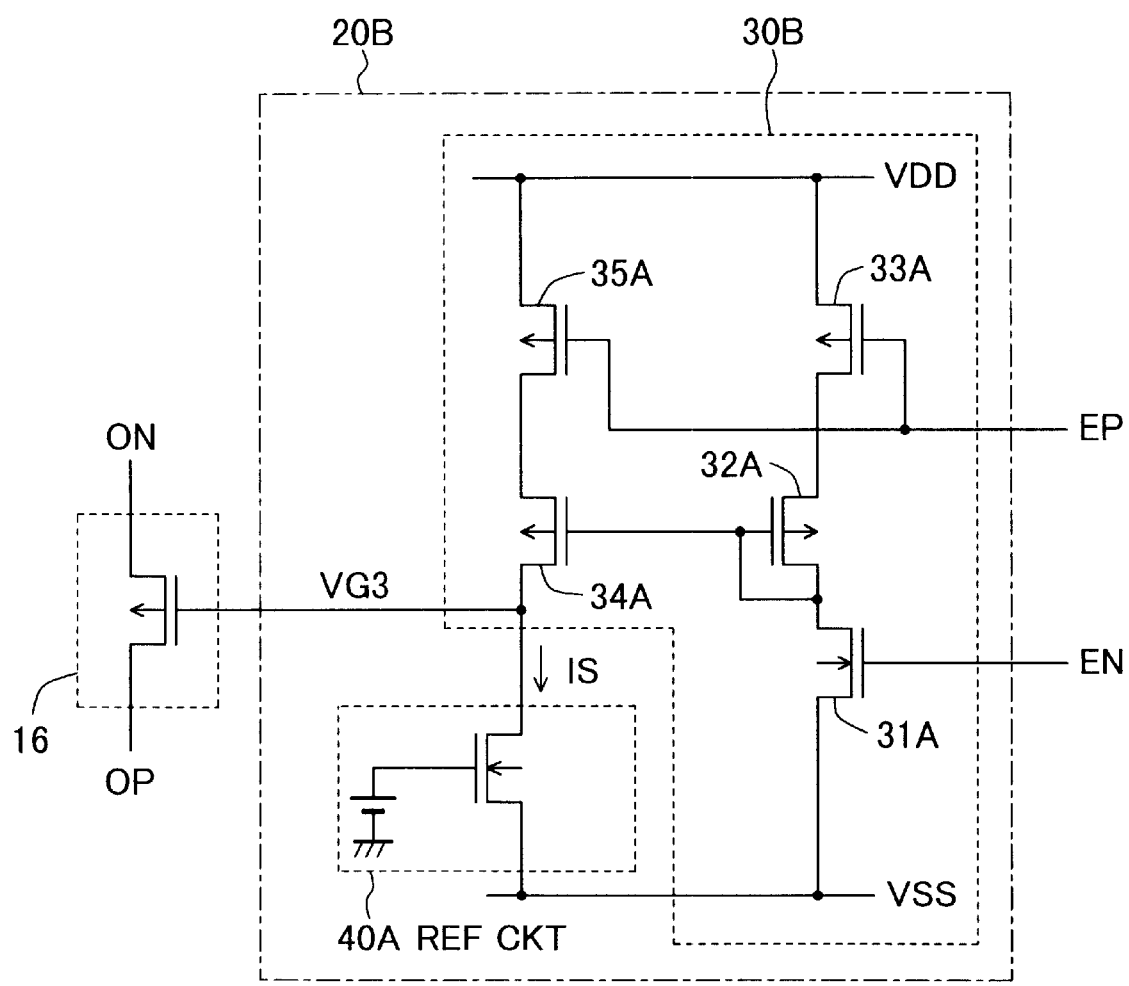
FIG. 6 is a diagram showing a gate potential difference and its adjusting circuit of a fifth embodiment according to the present invention.

FIG. 6 shows another configuration example of a gate potential difference and its adjusting circuit in FIG. 1 as a fifth embodiment.

In this circuit, the configuration is such that conductivity types of all the FETs in FIG. 2 are changed and further VDD and VSS are interchanged. The FETs after change are respectively designated by like reference characters 16, 31A to 35A and 40A.

If Min(IP/$\mu$, IN$\mu$)>IS arises, then the potential VG3 rises to increase the internal resistance of the P-channel FET 16, and the gate potential VG1 rises and the gate potential VG2 falls. Hence, the current IP and IN decrease so that the idle current Min(IP, IN) comes close to $\mu$·IS. Contrary to this, if Min(IP/$\mu$, IN$\mu$)<IS arises, then the potential VG3 falls to decrease the internal resistance of the P-channel FET 16, and the gate potential VG1 falls or the gate potential VG2 rises. Hence, the current IP and IN increase so that the idle current Min(IP, IN) comes close to $\mu$·IS.

Sixth Embodiment

Figure 7:
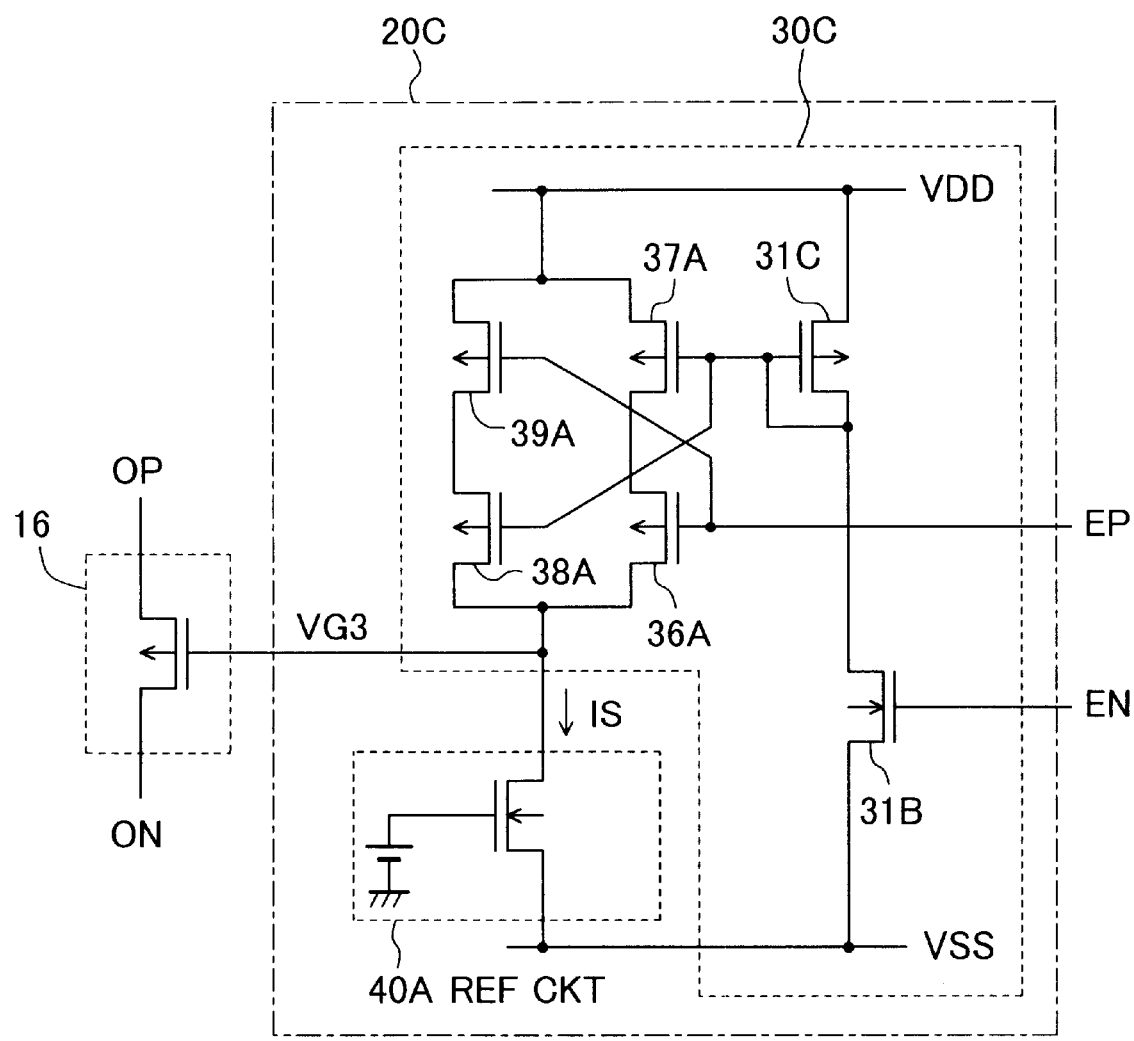
FIG. 7 is a diagram showing a gate potential difference and its adjusting circuit of a sixth embodiment according to the present invention.

FIG. 7 shows a further configuration example of a gate potential difference and its adjusting circuit in FIG. 1 as a sixth embodiment.

In this circuit, the configuration is such that conductivity types of all the FETs in FIG. 3 are changed and further VDD and VSS are interchanged. The FETs after change are respectively designated by like reference characters.

Operations of this circuit can be understood from the descriptions of FIGS. 3 and 6 and therefore, explanation of this circuit is omitted.

Seventh Embodiment

Figure 8:
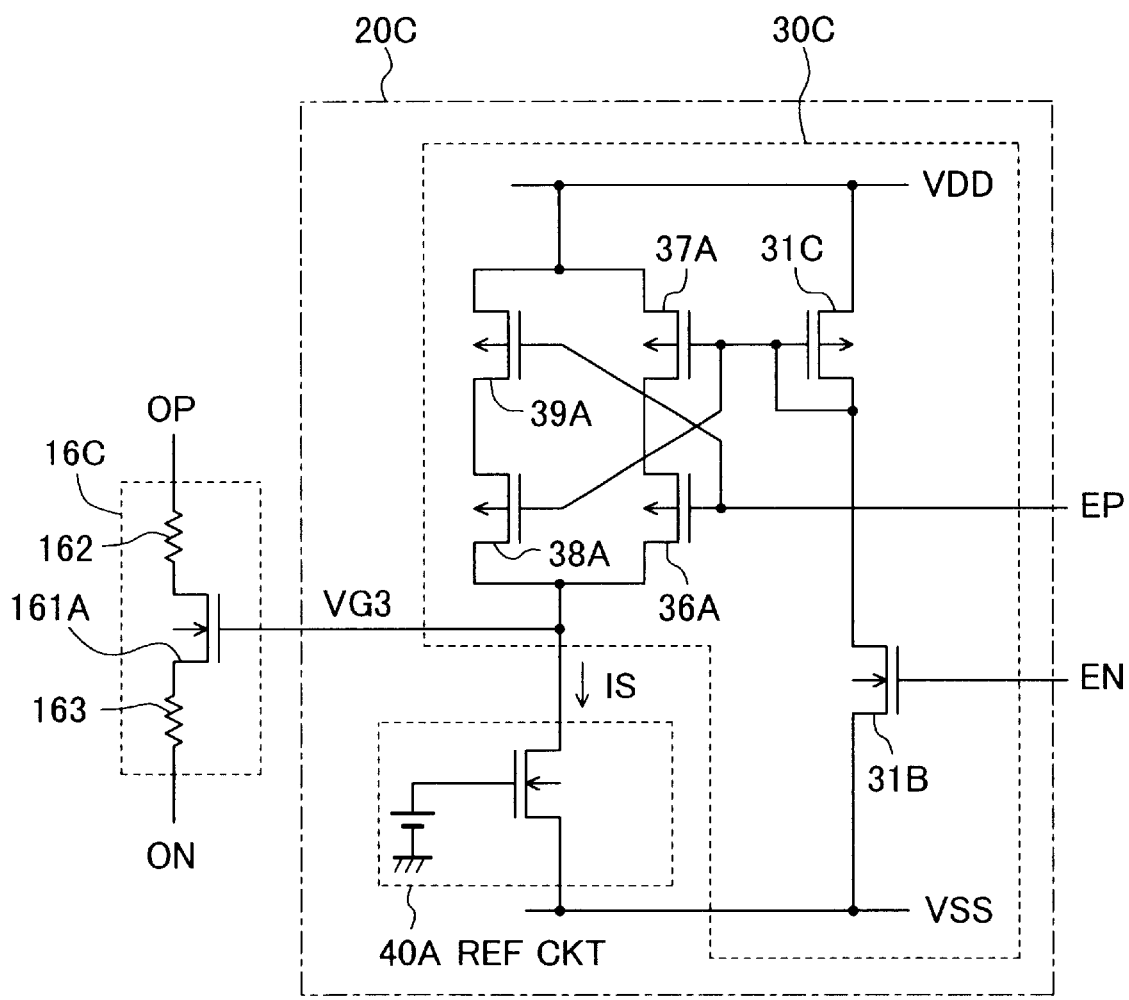
FIG. 8 is a diagram showing a gate potential difference and its adjusting circuit of a seventh embodiment according to the present invention.

FIG. 8 shows still another configuration example of a gate potential difference and its adjusting circuit in FIG. 1 as a seventh embodiment.

In a gate potential difference circuit 16C, the resistors 163 and 162 are respectively connected to the source and drain of an N-channel FET 161A and the gate potential VG3 of the N-channel FET 161A is controlled by the gate potential difference adjusting circuit 20C which is same as that of FIG. 7.

Operations of this circuit can be understood from the descriptions of FIG. 4 and therefore, explanation of this circuit is omitted.

Eighth Embodiment

Figure 9:
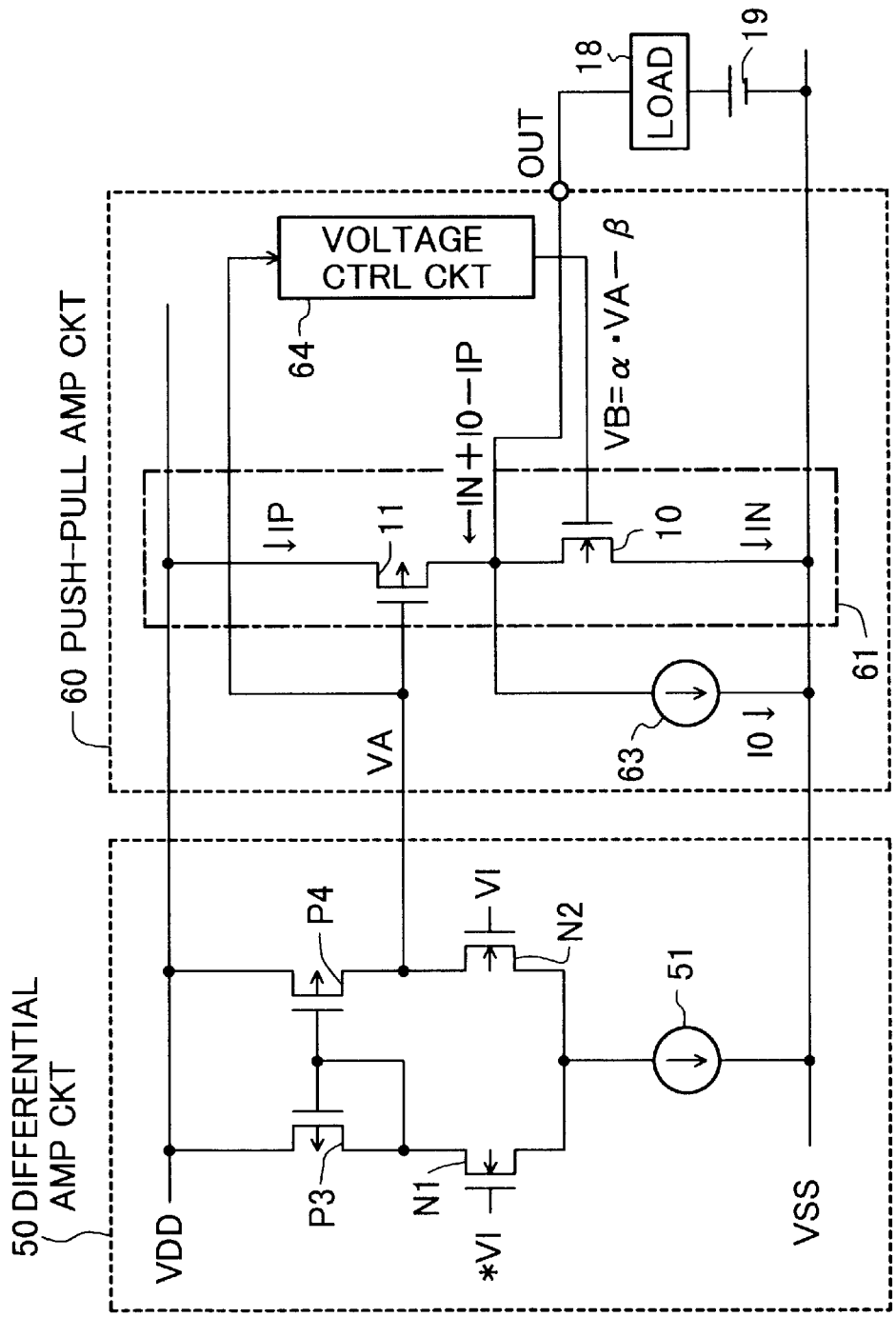
FIG. 9 is a schematic circuit diagram showing an operational amplifier of the eighth embodiment according to the present invention.

FIG. 9 shows a schematic configuration of an operational amplifier of the eighth embodiment according to the present invention.

This is incorporated, for example, in an integrated circuit and used in mobile electronic equipment such as a portable telephone.

This circuit comprises a differential amplifier 50 and a class AB push-pull amplifier 60 (hereinafter simply referred to as amplifier) for amplifying the drive capability of the output voltage VA of the circuit 50.

In FIG. 9, P3, P4 and 11 each are P-channel FETs, and N1, N2 and 10 each are N-channel FETs.

In the differential amplifier 50, the sources of the transistors N1 and N2 are connected through a constant current source 51 to a conductor having the power supply potential VSS, and the drains of the transistors N1 and N2 are connected through the transistors P3 and P4, respectively, to the power supply potential VDD (VDD>VSS). The gate of the transistor P3 is connected to its drain and the gate of the transistor P4, and the transistors P3 and P4 constitute a current mirror circuit.

Input voltage signals *VI and VI that are mutually complementary are respectively provided to the gates of the transistors N1 and N2, and a voltage VA is outputted from the drain of the transistor N2 to provide to the amplifier 60.

When the input voltage signals *VI and VI fall and rise, respectively, the voltage VA falls, while in the reverse case, the voltage VA rises.

In the push-pull output circuit 61 of the amplifier 60, the connection node between the transistors 11 and 10 is connected to the output OUT. A constant current source 63 is connected to the transistor 10 in parallel. The voltage signal VA is provided to the gate of the transistor 11. A voltage control circuit 64 generates a voltage VB obtained by multiplying the voltage VA by α and shifting the voltage α·VA by −β, that is, the voltage VB is expressed by the above equation (6), where α is a predetermined positive value, and β is a predetermined value. β has a positive sign in the case of FIG. 9. The circuit 64 provides the voltage VB to the gate of the transistor 10.

The load 18 and the DC power supply 19 are connected in series between the output OUT and the conductor having the power supply potential VSS.

As shown in FIG. 9, the currents flowing through the transistors 11 and 10, and the constant current source 63 are designated as IP, IN and IO, respectively.

Figure 10:
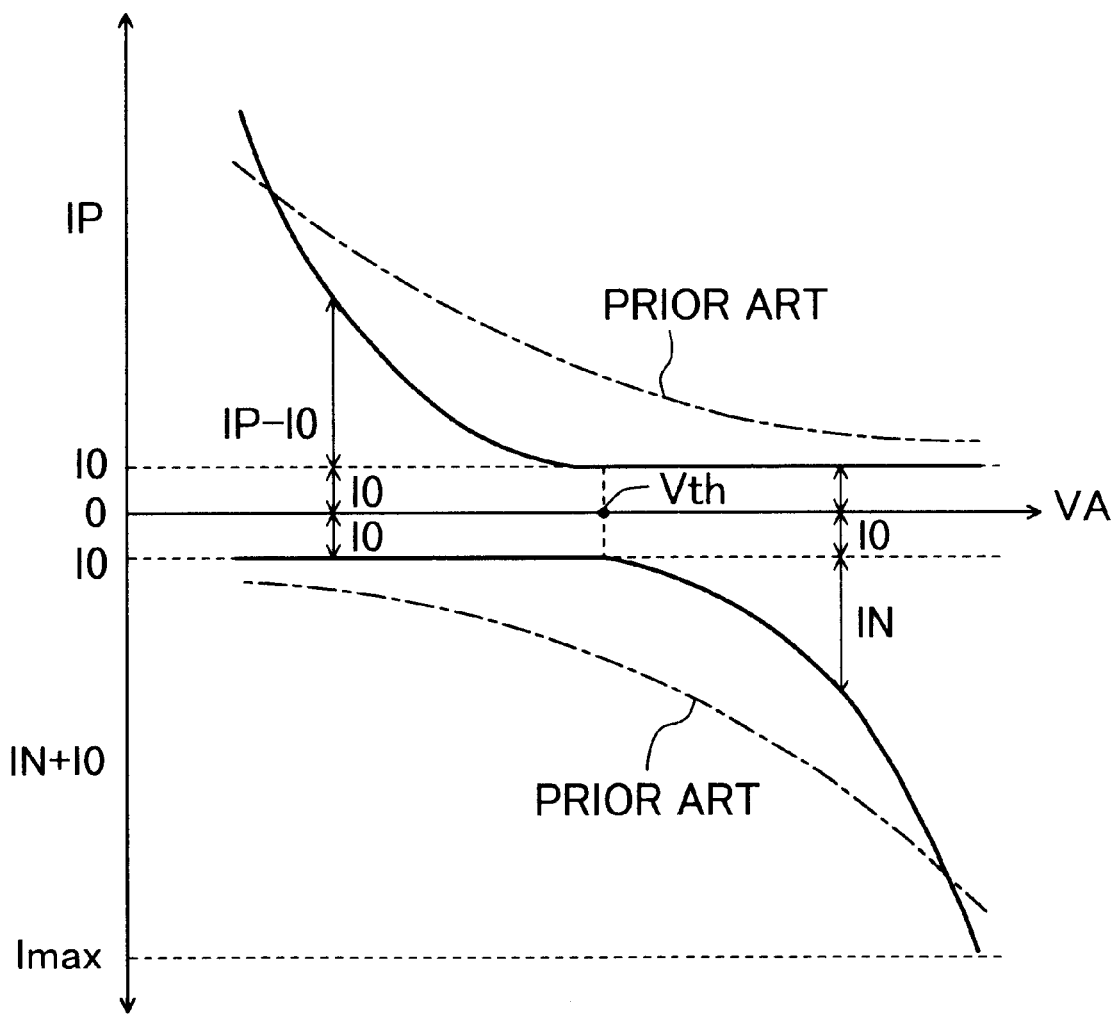
FIG. 10 is a graph showing voltage-current characteristics of the push-pull output circuit in FIG. 9.

FIG. 10 shows a relation of the voltage VA with the currents IP and (IN+IO).

Design parameters are determined so that when the voltage VB is the threshold voltage Vth of the transistor 10, the relation IP=IO holds. In this case, IN=0 and the current−(IN+IO−IP) flowing through the load 18 is zero.

From this stable biased state, when the voltage VA rises, the internal resistance of the transistor 11 increases and the current IP decreases. Because of α>0, with rise in the voltage VA, the voltage VB also rises, the internal resistance of the transistor 10 decreases and the current IN increases. Accordingly, a current (IN+IO−IP) flows in from the load 18 to the output OUT.

Contrary to this, when the voltage VA falls from the stable biased state, the internal resistance of the transistor 11 decreases and the current IP increases. With fall in the voltage VA, VB falls, the internal resistance of the transistor 10 increases, and the current IN decreases. Accordingly, a current−(IN+IO−IP) flows out from the output OUT to the load 18.

The current IN=I is approximately expressed by the above equations (4) and (5). Accordingly, the equation (7) holds.

From this equation (7), it is apparent that the current drive capability of the amplifier 60 can be improved by determining a proper large value of α. For this value of α, it is possible to make VB=Vth hold, that is, VA=(β+Vth)/α hold by determining a proper value of β based on the equation (6). Herein IN=0 holds.

As shown in FIG. 10, when VB<Vth, IN=0 holds and the idle current component in the current IP is equal to the current IO flowing through the constant current source 63. Thereby, it is possible to make the idle current constant. Furthermore, the idle current IO can be determined independently of the maximum value of the current IN.

Accordingly, not only the improvement of the load drive capability and the decrease in the idle current can be effectively achieved, but also circuit design can be easier.

Ninth Embodiment

Figure 11:
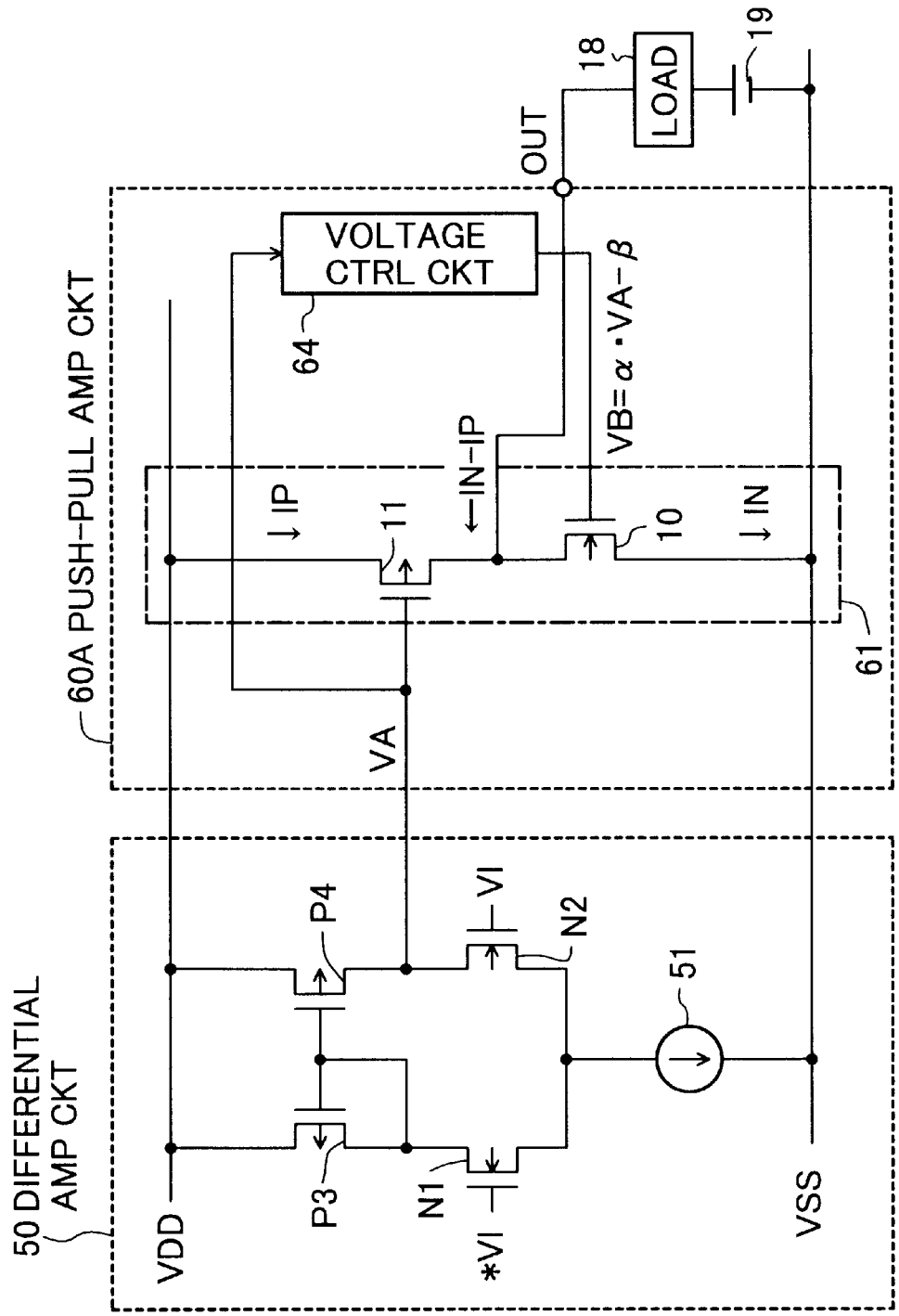
FIG. 11 is a schematic circuit diagram showing an operational amplifier of the ninth embodiment according to the present invention.

FIG. 11 shows a schematic configuration of an operational amplifier of the ninth embodiment according to the present invention.

This circuit has a configuration that is obtained by deleting the constant current source 63 in the circuit of FIG. 9.

Due to this deleting, when the load 18 is in connection, IN=0 is scarcely realized in the stable biased state where IP=IN in order to decrease cross-over distortion. In this state, the voltage VB is made to be close to the threshold voltage Vth but to satisfy the relation VB>Vth.

When the voltage VA falls from this stable biased state, it is allowed to be VB<Vth, whereby the idle current of the transistors 11 and 10 can be smaller.

Further, the current drive capability of the amplifier 60A can be improved with a properly large value of α.

Accordingly, improvement of the load drive capability and decrease in the idle current can be achieved.

Tenth Embodiment

Figure 12:
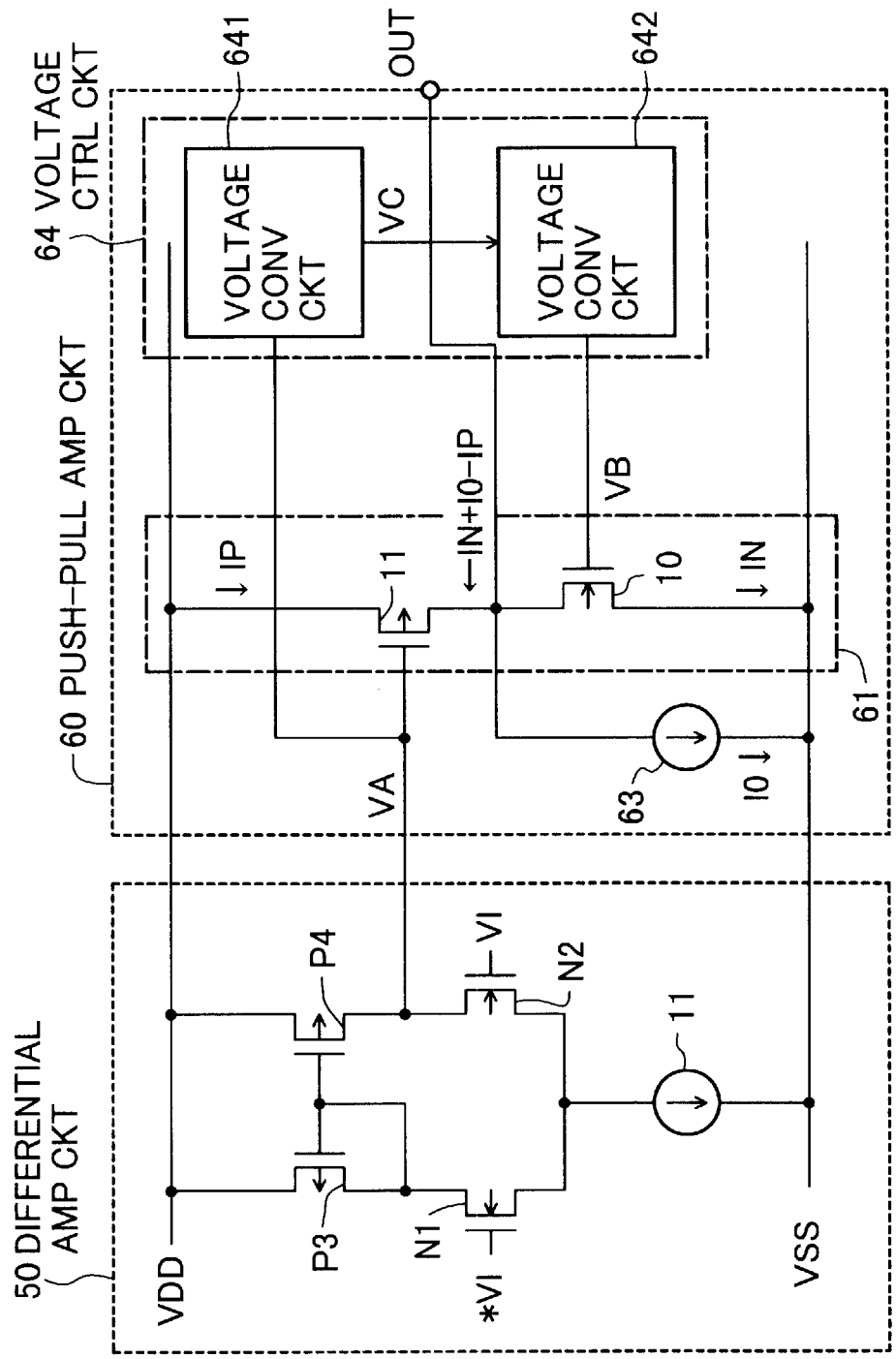
FIG. 12 is a schematic circuit diagram showing an operational amplifier of the tenth embodiment according to the present invention.

FIG. 12 shows a schematic configuration of an operational amplifier of the tenth embodiment according to the present invention.

In this circuit, the voltage control circuit 64 of FIG. 9 consists of voltage conversion circuits 641 and 642.

The voltage conversion circuit 641 converts the voltage VA to the voltage VC, and the voltage conversion circuit 642 converts the voltage VC to the voltage VB.

Since the voltage VA is converted to the voltage VB in two steps, it is easier to determine α and β in the design step. That is, the voltages VC and VB are approximately expressed by the following equations:

$$VC = \alpha 1 \cdot VA - \beta 1$$

$$VB = \alpha 2 \cdot VC - \beta 2$$

The following equation is derived from the above two equations:

$$VB = (\alpha 1 \cdot \alpha 2) VA - (\alpha 2 \cdot \beta 1 + \beta 2)$$

Accordingly, it is only required that α1, α2, β1 and β2, each of which is substantially constant, are determined such that α=α1·α2 and β=α2·β1+β2 hold. If α1>0, then α2>0, while if α1<0, then α2<0.

The other points are same as those of FIG. 9.

In the below embodiments, FIGS. 13 and 14 each are configuration examples of FIG. 12, and FIGS. 16 and 17 each are configuration examples of FIG. 11.

Eleventh Embodiment

Figure 13:
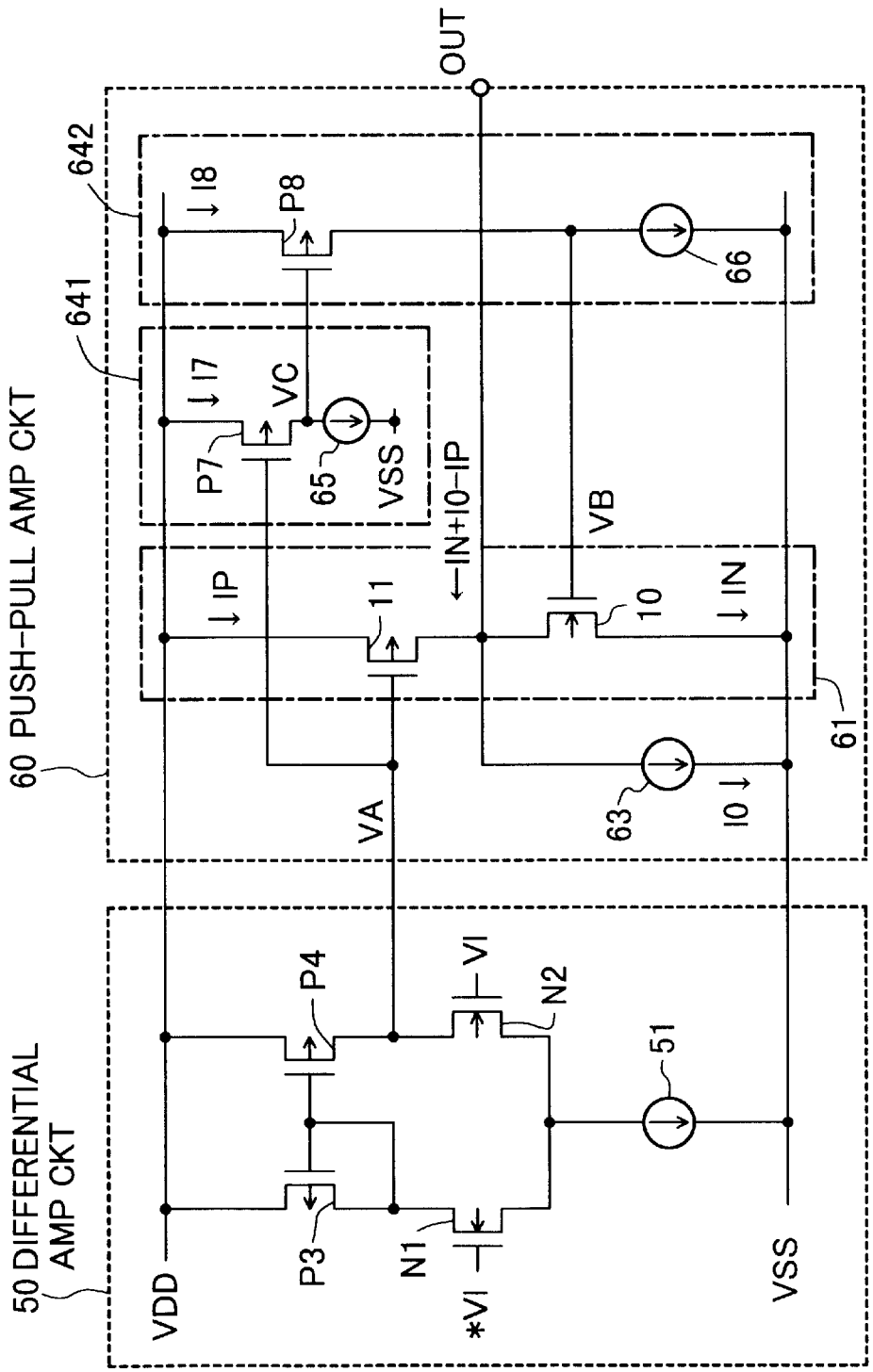
FIG. 13 is a circuit diagram showing an operational amplifier of the eleventh embodiment according to the present invention.

FIG. 13 is the operational amplifier of the eleventh embodiment according to the present invention.

In FIG. 13, P7 and P8 each are P-channel FETs.

In the voltage conversion circuit 641 of the amplifier 60, the transistor P7 and a constant current source 65 are connected in series between conductors having the power supply potentials VDD and VSS. The voltage VA is provided to the gate of the transistor P7 and the voltage VC is outputted from a connection node between the transistor P7 and the constant current source 65. Since the constant current source 65 is connected to the transistor P7 in series, when the voltage VA rises, the internal resistance of the transistor P7 increases, then the voltage VC falls. Contrary to this, when the voltage VA falls, the internal resistance of the transistor P7 decreases, then the voltage VC rises. Therefor, α1<0.

In the voltage conversion circuit 642, similar to the voltage conversion circuit 641, the transistor P8 and a constant current source 66 are connected in series between the conductors having the power supply potentials VDD and VSS. The voltage VC is provided to the gate of the transistor P8, and the voltage VB is outputted from a connection node between the transistor P8 and the constant current source 66.

Since the constant current source 66 is connected to the transistor P8 in series, when the voltage VC rises, the internal resistance of the transistor P8 increases, then the voltage VB falls. Contrary to this, when the voltage VC falls, the internal resistance of the transistor P8 decreases, then the voltage VB rises. Therefor, α2<0.

Accordingly, when the voltage VA rises, the voltage VB also rises, while the voltage VA falls, the voltage VB also falls.

The other points are same as those of FIG. 12.

Next, equations of α and β in the above equation (6) will be derived.

Denoting the currents flowing through the transistor P7, the constant current source 65, the transistor P8 and the constant current source 66 as I7, I65, I8 and I66, respectively, the threshold voltage of the transistor P7 as Vth7, the transconductances of the transistors P7 and P8 as gm7 and gm8, respectively, the source-drain resistances of the transistors P7 and P8 as R7 and R8, respectively, and the internal resistances of the constant current source 65 and 66 as R25 and R26, respectively, the following equations holds.

$$I7 = gm7(VDD - VA - Vth7) \quad (10)$$

$$VC = (I7 - I65)R7//R65 + VDD \cdot R65/(R65 + R7) \quad (11)$$

$$I8 = gm8(VDD - VC - Vth8) \quad (12)$$

$$VB = (I8 - I66)R8//R66 + VDD \cdot R66/(R66 + R8) \quad (13)$$

The equation (13) corresponds to the equation (6), and using the relations in the equations (10) to (12), α and β are expressed by the following equations.

$$\alpha = gm8 \cdot gm7 \cdot (R65//R7) \cdot (R8//R66)$$

$$\beta = gm8 \cdot (R8//R66) \cdot \{VDD + gm7 \cdot Vth7(R7//R65) + -I65(R7//R65) - gm7 \cdot VDD(R7//R65) - VDD \cdot R65/(R65 + R7) - Vth8\} - I66 \cdot (R8//R66) - VDD \cdot R66/(R66 + R8)$$

Herein a symbol // designates parallel connection and, for example, R7//R65=R7·R65/(R7+R65).

Twelfth Embodiment

Figure 14:
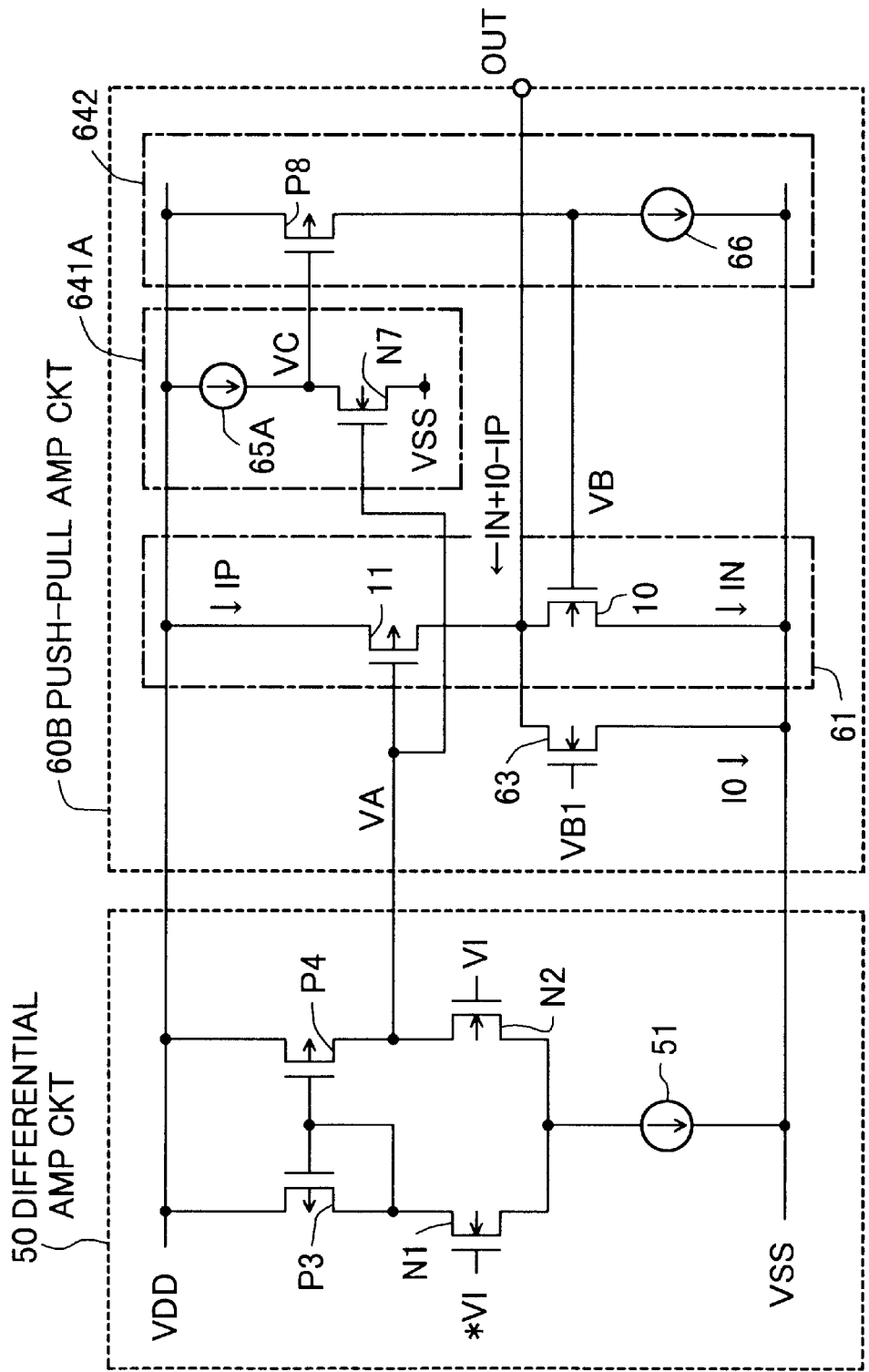
FIG. 14 is a circuit diagram showing an operational amplifier of the twelfth embodiment according to the present invention.

FIG. 14 shows an operational amplifier of the twelfth embodiment according to the present invention.

In FIG. 14, N7 is an N-channel FET.

In a voltage conversion circuit 641A of an amplifier 60B, a constant current source 65A and the transistor N7 are connected in series between conductors having power supply potentials VDD and VSS. The voltage VA is provided to the gate of the transistor N7, and the voltage VC is outputted from a connection node between the transistor N7 and the constant current source 65A. Since the constant current source 65A is connected to the transistor N7 in series, when the voltage VA rises, the internal resistance of the transistor N7 decreases, then the voltage VC falls. Contrary to this, when the voltage VA falls, the internal resistance of the transistor P7 increases, then the voltage VC rises.

The other points are same as those of FIG. 13.

Thirteenth Embodiment

Figure 15:
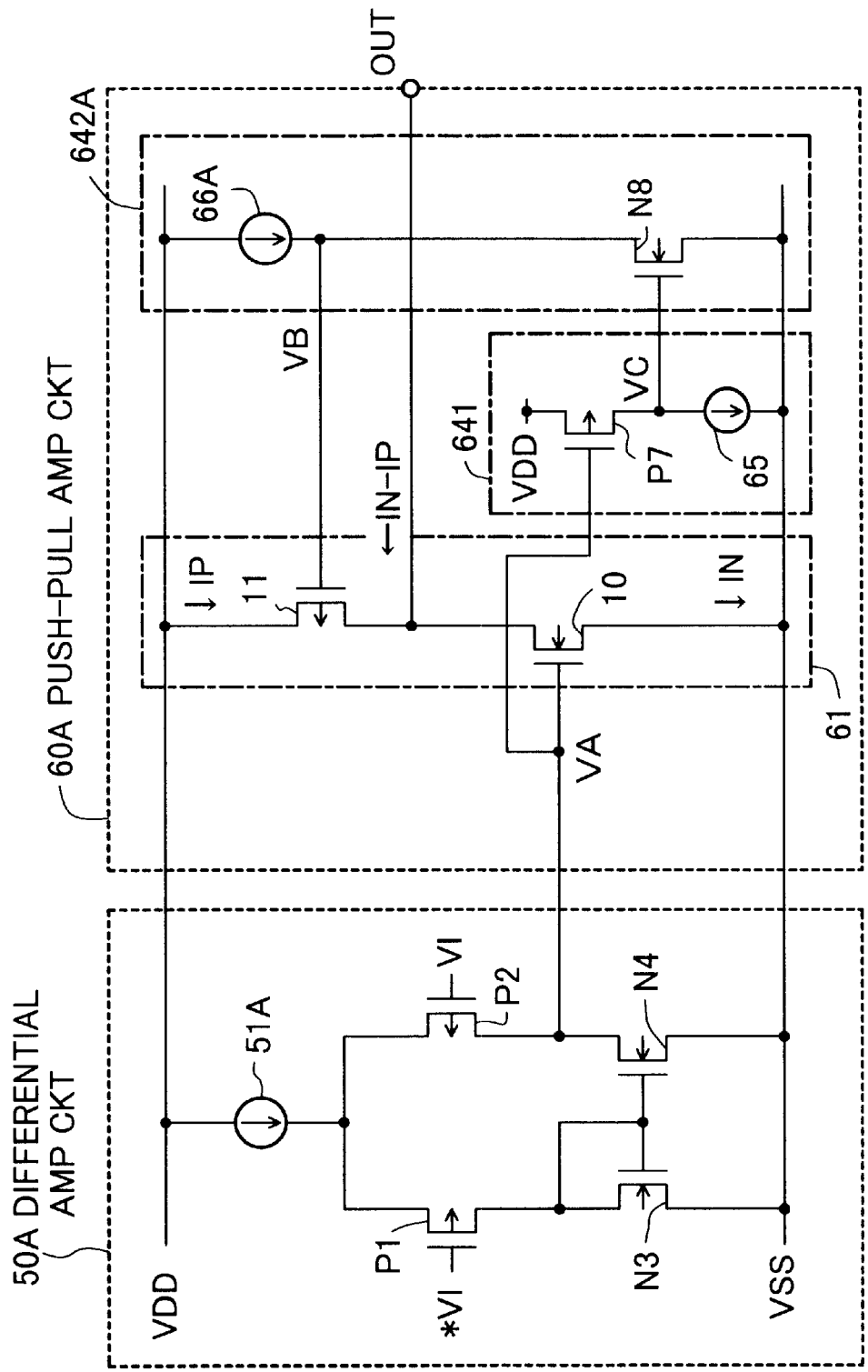
FIG. 15 is a circuit diagram showing an operational amplifier of the thirteenth embodiment according to the present invention.

FIG. 15 shows an operational amplifier of the thirteenth embodiment according to the present invention.

In FIG. 15, P1 and P2 each are P-channel FETs and N3, N4 and N8 each are N-channel FETs.

In the amplifiers 50 and 60 of FIG. 13, except for the voltage conversion circuit 641, by changing conductivity types of the FETs and also interchanging the power supply potentials VDD and VSS to each other, the configuration of a differential amplifier 50A and an amplifier 60A in FIG. 15 is obtained. The voltage VA is provided to the gate of the transistor 10 and the output voltage VB of a voltage conversion circuit 642A is provided to the gate of the transistor 11.

When the voltage VA rises, the internal resistance of the transistor 10 decreases, and the current IN increases.

On the other hand, when the voltage VA rises, the voltage VC falls by the voltage conversion circuit 641. In the voltage conversion circuit 642A, since a constant current source 66A is connected to the transistor N8 in series, when the voltage VC falls, the internal resistance of the transistor N8 increases, then the voltage VB rises. Hence, the internal resistance of the transistor 11 increases and the current IP decreases.

Accordingly, when the voltage VA rises, the current IN increases and the current IP decreases, whereby a current (IN−IP) increases.

Contrary to this, when the voltage VA falls, the internal resistance of the transistor 10 increases, and the current IN decreases.

On the other hand, when the voltage VA falls, the voltage VC rises by the voltage conversion circuit 641. In the voltage conversion circuit 642A, since the voltage VC rises, the internal resistance of the transistor N8 decreases, and the voltage VB falls. Hence, the internal resistance of the transistor 11 decreases and the current IP increases.

Accordingly, when the voltage VA falls, then the current IN decreases and the current IP increases, whereby the current (IN−IP) decreases.

In this thirteenth embodiment, contrary to the case of FIG. 13, since the voltage VB is provided to the gate of the transistor 11 and the voltage VA is provided to the gate of the transistor 10, the relations of VB>VA and β<0 hold.

Fourteenth Embodiment

Figure 16:
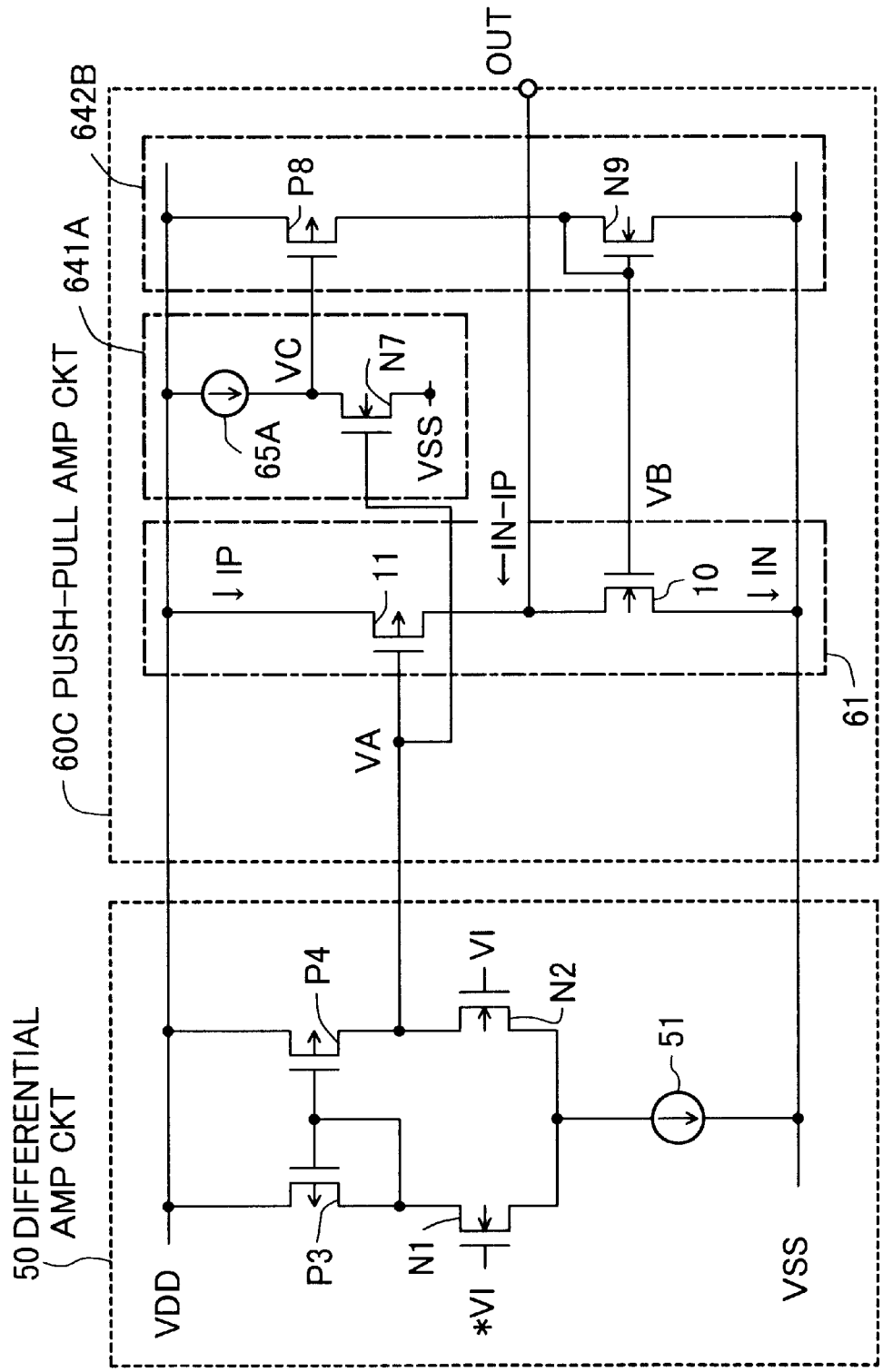
FIG. 16 is a circuit diagram showing an operational amplifier of the fourteenth embodiment according to the present invention.

FIG. 16 shows an operational amplifier of the fourteenth embodiment according to the present invention.

In FIG. 16, N9 is an N-channel FET.

In a voltage conversion circuit 642B of an amplifier 60C, the transistor N9 whose drain and gate are connected mutually is substituted for the constant current source 66 in FIG. 14. The gate of the transistor N9 is connected to the gate of the transistor 10, and the transistors N9 and N10 constitute a current mirror circuit. The transistors N9 and N10 respectively serve as the input and output stages of the current mirror circuit.

The other points are same as those of FIG. 14 from which the constant current source 63 is omitted.

When the voltage VC is raised by fall in the voltage VA, the internal resistance of the transistor P8 increases and the current flowing through the transistor N9 decreases, whereby the current IN decreases. In other words, with the fall in the voltage VA, the voltage VB falls and the current IN decreases.

Contrary to this, when the VC falls by rise in the voltage VA, then the internal resistance of the transistor P8 decreases, and the current flowing through the transistor N9 increases, whereby the current IN increases. In other words, with rise in the voltage VA, the voltage VB rises and the current IN increases.

Fifteenth Embodiment

Figure 17:
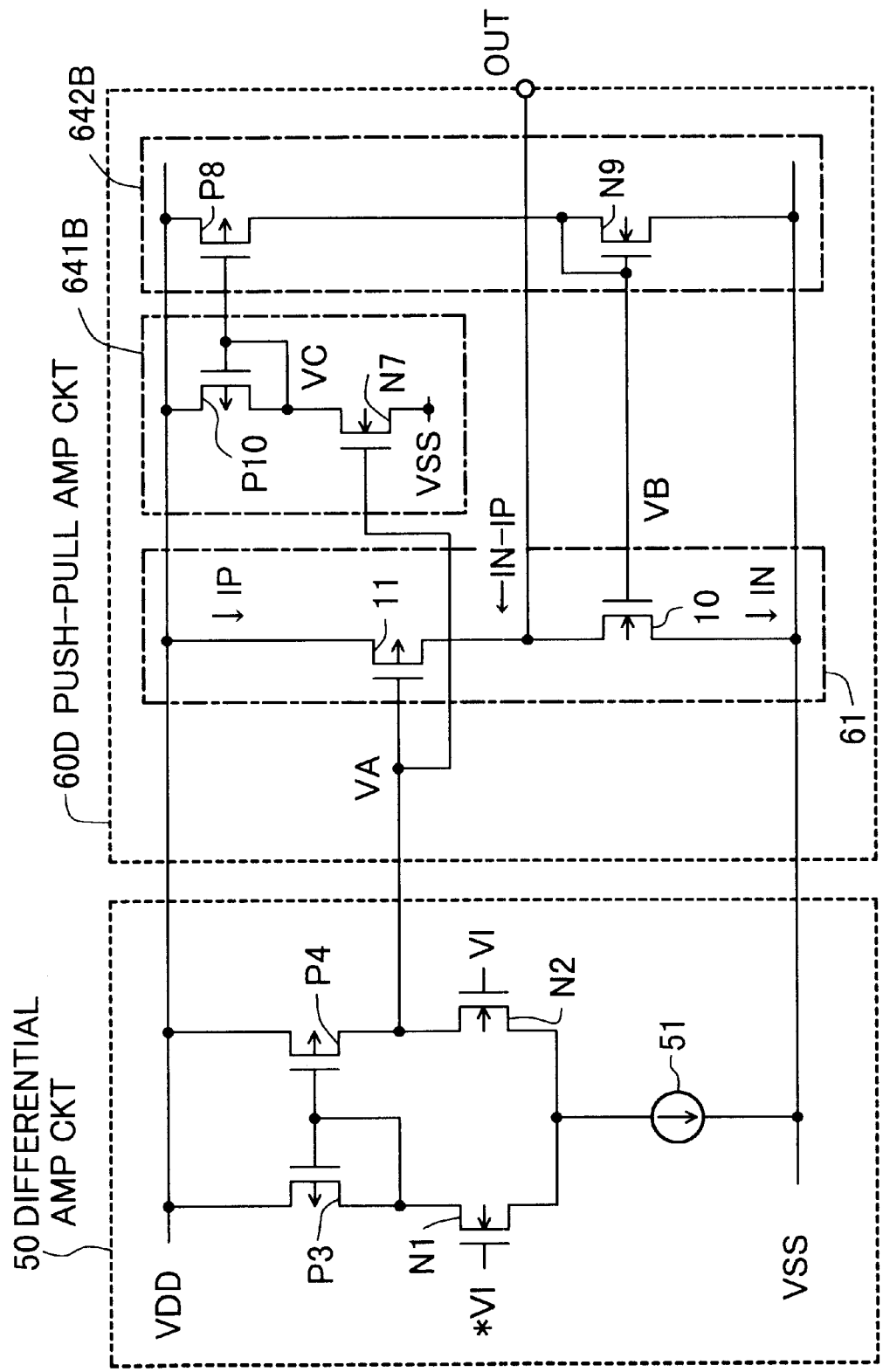
FIG. 17 is a circuit diagram showing an operational amplifier of the fifteenth embodiment according to the present invention.

FIG. 17 shows an operational amplifier of the fifteenth embodiment according to the present invention.

In FIG. 17, P10 is a P-channel FET.

In a voltage conversion circuit 641B of an amplifier 60D, the transistor P10 whose drain and gate are connected mutually is substituted for the constant current source 65A in FIG. 16. The gate of the transistor P10 is connected to the gate of the transistor P8, and the transistors P10 and P8 constitute a current mirror circuit. The transistors P10 and P8 respectively serve as the input and output stages of the current mirror circuit.

The other points are same as those of FIG. 16.

When the voltage VA rises, then the internal resistance of the transistor N7 decreases and the current flowing through the transistor P10 increases, whereby the current flowing through the transistor P8 also increases. Since the transistor N9 and the transistor 10 also constitute the current mirror circuit, the current IN also increases. In other words, with decrease in the internal resistance of the transistor N7, the voltage VC falls and the internal resistance of the transistor P8 decreases, whereby the voltage VB rises and the current IN increases.

Contrary to this, when the voltage VA falls, then the internal resistance of the transistor N7 increases and the current flowing through the transistor P10 decreases, whereby the current flowing through the transistor P8 also decreases and the current IN also decreases. In other words, with increase in the internal resistance of the transistor N7, the voltage VC rises and the internal resistance of the transistor P8 increases, whereby the voltage VB falls and the current IN decreases.

Sixteenth Embodiment

Figure 18:
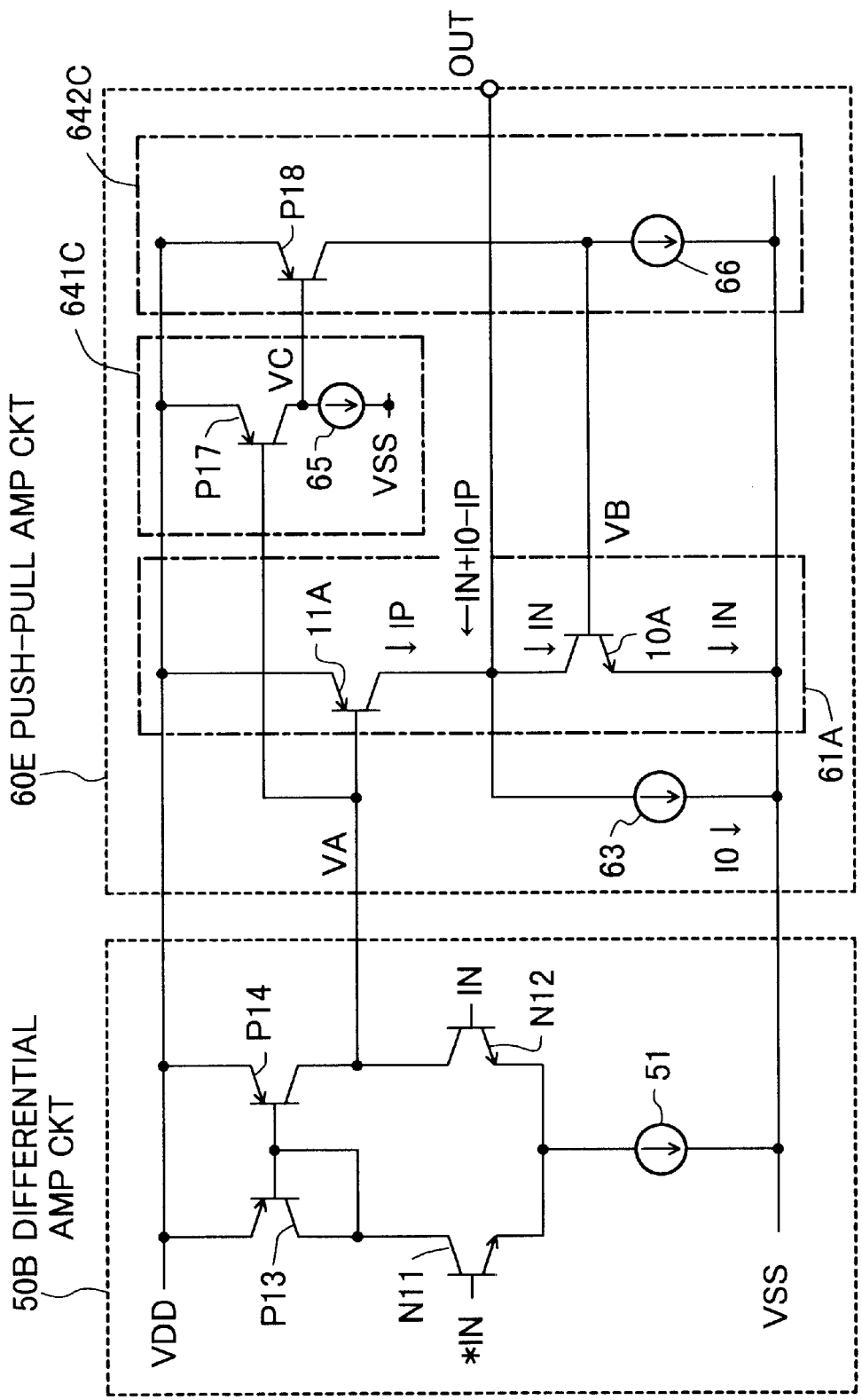
FIG. 18 is a circuit diagram showing an operational amplifier of the sixteenth embodiment according to the present invention.

FIG. 18 shows an operational amplifier of the sixteenth embodiment according to the present invention.

In FIG. 18, P13, P14, 11A, P17 and P18 each are PNP transistors, and N11, N12 and 10A each are NPN transistors.

This circuit has a configuration that is obtained by substituting a PNP transistor and an NPN transistor for a P-channel FET and an N-channel FET in FIG. 13, respectively.

It is common that like operations are performed even with such substitution, and operations of amplifiers 50B and 60E are respectively like as those of the amplifiers 50 and 60 in FIG. 13. Therefore, descriptions thereof are omitted.

Seventeenth Embodiment

Figure 19:
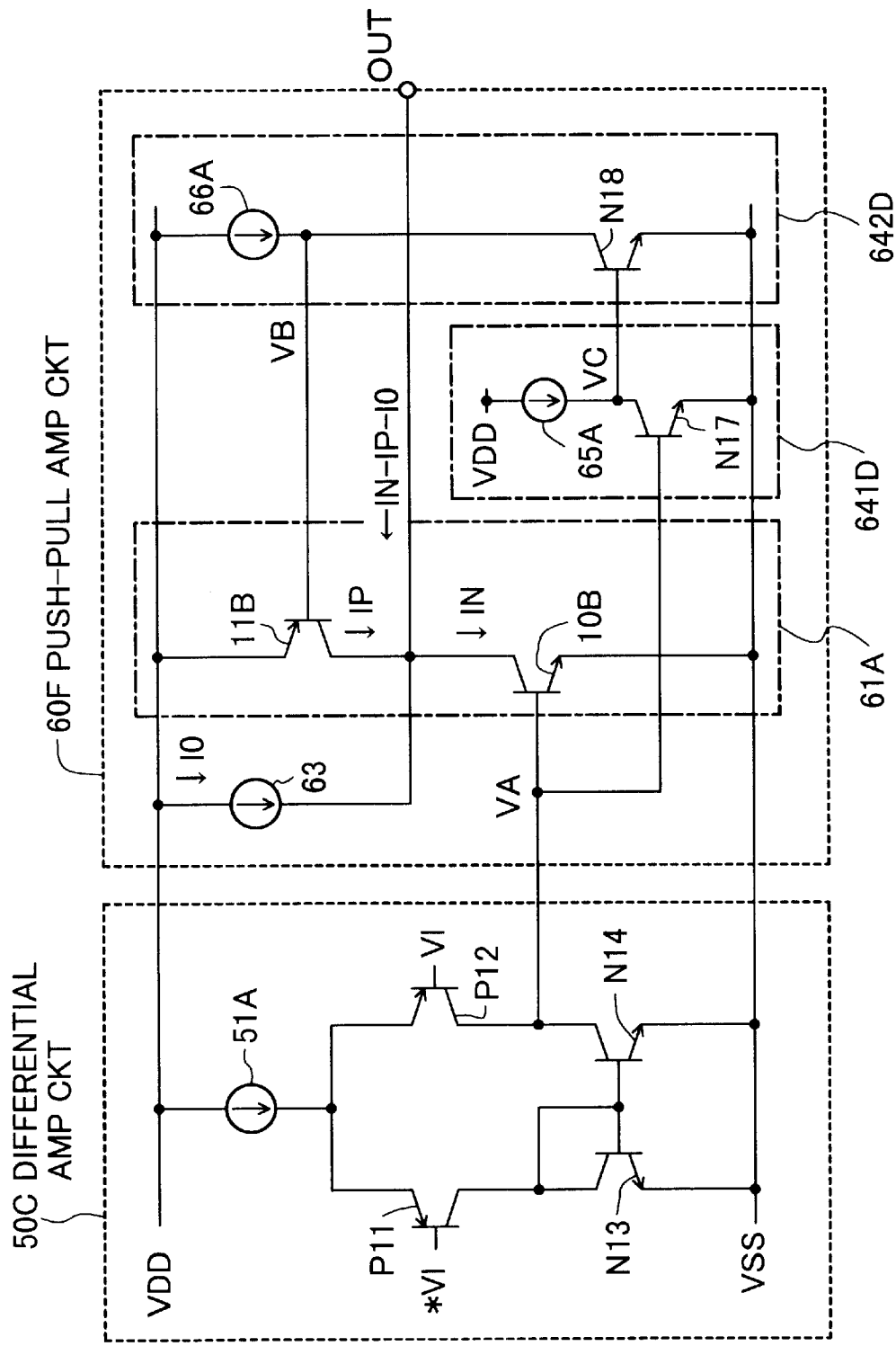
FIG. 19 is a circuit diagram showing an operational amplifier of the seventeenth embodiment according to the present invention.

FIG. 19 shows an operational amplifier of the seventeenth embodiment according to the present invention.

In FIG. 19, P11, P12 and 11B each are PNP transistors, and N3, N14, 10B, N17 and N18 each are NPN transistors.

This circuit has a configuration that is obtained by interchanging transistors of PNP and NPN and interchanging the power supply potentials VDD and VSS in FIG. 18.

It is common that like operations are performed even with such interchanging, and operations of amplifiers 50C and 60F are respectively like as those of the differential amplifiers 50B and 60E in FIG. 18. Therefore, descriptions thereof are omitted.

Although preferred embodiments of the present invention has been described, it is to be understood that the invention is not limited thereto and that various changes and modifications may be made without departing from the spirit and scope of the invention.

For example, in a circuit employing FETs, they may be substituted for bipolar transistors. In this case, the circuit employing bipolar transistors is obtained by substituting NPN transistors and PNP transistors for the N-channel FETs and P-channel FETs, respectively.

Further, a gate potential difference circuit may be of a configuration having a level shift circuit such as a diode connected in series to a controlled transistor.

Combinations of circuit blocks among the above-described embodiments may be adopted.

Furthermore, effect like that described in regard to the circuit of FIG. 11 can be obtained even when such a current control circuit is employed instead of the transistor 10 in FIG. 11 that it controls the current IN flowing through itself in response to the voltage VB so that relations IN=GM(VB−VTH) for VB>VTH and IN=0 for VB<VTH are satisfied, where GM designates the transconductance of the current control circuit and VTH designates the threshold voltage of the current control circuit. In addition, in the same way FIG. 9, a constant current circuit may be connected in parallel to this current control circuit to decrease power consumption as described above.

What is claimed is:

1. A push-pull amplifier circuit comprising:
    a push-pull output circuit having first and second transistors (11 and 10) connected in series between first and second power supply potentials, a conductivity of said second transistor being opposite to that of said first transistor, each of said first and second transistors having a control input;
    a control input potential difference circuit (16A) having first and second ends (OP and ON) being connected to said control inputs of said first and second transistors and a control input for receiving a control signal (VG3) to adjust a voltage between said first and second ends in response to said control signal, said control signal being generated on the basis of an idle current that flows through said first and second transistors; and
    an input circuit (17) for changing potentials of said first and second ends in response to an input signal with keeping said voltage substantially constant.

2. A push-pull amplifier circuit according to claim 1, further comprising:
    a reference circuit (40) for outputting a reference value (IS); and
    an idle current detecting and comparing circuit (30) for detecting a current proportional to said idle current, and for generating said control signal (VG3) so that said detected current becomes equal to said reference value.

3. A push-pull amplifier circuit according to claim 1, wherein said input circuit (17) comprises:
    a constant current source (12) connected between said first end and said first power supply potential, said constant current source includes a transistor having a control input for receiving a predetermined potential; and
    an input transistor (15), connected between said second end and said second power supply potential, having a control input for receiving an input signal (VI).

4. A push-pull amplifier circuit according to claim 2, wherein said control input potential difference circuit (16A) includes a transistor, connected between said first and second ends, having a control input as said control input of said control input potential difference circuit.

5. A push-pull amplifier circuit according to claim 4,
wherein said reference circuit (40) is a transistor having a control input for receiving a predetermined potential,
wherein said idle current detecting and comparing circuit (30) comprises:
a third transistor (31) connected so as to constitute a current mirror circuit with said first transistor (11);
a fourth transistor (33) connected so as to constitute a current mirror circuit with said second transistor (10);
a fifth transistor (32) connected between said third and fourth transistors; and
a sixth transistor (34), connected so as to constitute a current mirror circuit with said fifth transistor, connected in series to said transistor of said reference circuit.

6. A push-pull amplifier circuit according to claim 5, wherein said idle current detecting and comparing circuit (30) further comprises a seventh transistor (35) connected in series to said sixth transistor (34), connected so as to constitute a current mirror circuit with said second transistor (10).

7. A push-pull amplifier circuit according to claim 4,
wherein said reference circuit (40) is a transistor having a control input for receiving a predetermined potential,
wherein said idle current detecting and comparing circuit (30A) comprises:
a third transistor (31) connected so as to constitute a current mirror circuit with said first transistor (11);
a fourth transistor (31A) connected in series to said third transistor (31);
a fifth transistor (37) connected so as to constitute a current mirror circuit with said fourth transistor (31A);
a sixth transistor (39) connected so as to constitute a current mirror circuit with said second transistor (10);
a seventh transistor (38), connected between said sixth transistor (39) and said transistor of said reference circuit (40), connected so as to constitute a current mirror circuit with said fourth transistor (31A); and
an eighth transistor (36) connected between said fifth transistor (37) and said transistor of said reference circuit (40), connected so as to constitute a current mirror circuit with said second transistor (10).

8. A push-pull amplifier circuit according to claim 1,
wherein said first power supply potential is higher than said second power supply potential,
wherein said push-pull output circuit has a P-channel FET as said first transistor and an N-channel FET as said second transistor, one end of said P-channel FET is connected to said first power supply potential, one end of said N-channel FET is connected to said second power supply potential.

9. A push-pull amplifier circuit according to claim 3, wherein said transistor of said constant current source (12) of said input circuit (17) is a P-channel FET, and said input transistor (15) is an N-channel FET.

10. A push-pull amplifier circuit according to claim 6,
wherein said reference circuit (40) is a P-channel FET having a gate for receiving a predetermined potential,
wherein said third transistor (31) is a P-channel FET,
wherein said fourth to seventh transistors (33, 32, 34 and 35) each are N-channel FETs.

11. A push-pull amplifier circuit according to claim 7,
wherein said reference circuit (40) is a P-channel FET having a gate for receiving a predetermined potential,
wherein said third transistor (31) is a P-channel FET,
wherein said fourth to eighth transistors (31A, 37, 39, 38 and 36) each are N-channel FETs.

12. A push-pull amplifier circuit according to claim 11, wherein said transistor of said control input potential difference circuit (16A) is an N-channel FET.

13. A push-pull amplifier circuit according to claim 11, wherein said transistor of said control input potential difference circuit (16B) is a P-channel FET, and said control input potential difference circuit (16B) further comprises a resistor connected in series thereto.

14. A push-pull amplifier circuit according to claim 6,
wherein said reference circuit (40A) is an N-channel FET having a gate for receiving a predetermined potential,
wherein said third transistor (31A) is an N-channel FET,
wherein said fourth to seventh transistors (33A, 32A, 34A and 35A) each are P-channel FETs.

15. A push-pull amplifier circuit according to claim 7,
wherein said reference circuit (40A) is an N-channel FET having a gate for receiving a predetermined potential,
wherein said third transistor (31B) is an N-channel FET,
wherein said fourth to eighth transistors (31C, 37A, 39A, 38A and 36A) each are P-channel FETs.

16. A push-pull amplifier circuit according to claim 15, wherein said transistor of said control input potential difference circuit (16) is a P-channel FET.

17. A push-pull amplifier circuit according to claim 15, wherein said transistor of said control input potential difference circuit (16C) is an N-channel FET, and said control input potential difference circuit further comprises a resistor connected in series thereto.

18. A push-pull amplifier circuit according to claim 1,
wherein said first power supply potential is lower than said second power supply potential,
wherein said push-pull output circuit has a N-channel FET (10) as said first transistor and an P-channel FET (11) as said second transistor, one end of said N-channel FET is connected to said first power supply potential, one end of said P-channel FET is connected to said second power supply potential.

19. A push-pull amplifier circuit according to claim 3, wherein said transistor of said constant current source (12A) of said input circuit (17A) is an N-channel FET, wherein said input transistor (15A) is a P-channel FET.

* * * * *

UNITED STATES PATENT AND TRADEMARK OFFICE
CERTIFICATE OF CORRECTION

PATENT NO.    : 6,380,808 B1
DATED         : April 30, 2002
INVENTOR(S)   : Yuasa et al.

It is certified that error appears in the above-identified patent and that said Letters Patent is hereby corrected as shown below:

<u>Title page,</u>
Item [75], change "Uasa" to -- Yuasa --.

Signed and Sealed this

Fifth Day of August, 2003

JAMES E. ROGAN
*Director of the United States Patent and Trademark Office*